(12) United States Patent
Hutchison et al.

(10) Patent No.: US 7,626,192 B2
(45) Date of Patent: Dec. 1, 2009

(54) SCAFFOLD-ORGANIZED CLUSTERS AND ELECTRONIC DEVICES MADE USING SUCH CLUSTERS

(75) Inventors: James E. Hutchison, Eugene, OR (US); Martin N. Wybourne, Hanover, NH (US); Scott M. Reed, Portland, OR (US)

(73) Assignee: State of Oregon Acting by the Through the State Board of Higher Education on Behalf of the University of Oregon, Eugene, OR (US)

( * ) Notice: Subject to any disclaimer, the term of this patent is extended or adjusted under 35 U.S.C. 154(b) by 721 days.

(21) Appl. No.: 11/120,352

(22) Filed: May 2, 2005

(65) Prior Publication Data

US 2006/0081835 A1    Apr. 20, 2006

Related U.S. Application Data

(60) Continuation-in-part of application No. 11/094,049, filed on Mar. 29, 2005, now Pat. No. 7,442,573, which is a division of application No. 10/783,515, filed on Feb. 19, 2004, now Pat. No. 6,872,971, which is a division of application No. 09/817,708, filed on Mar. 26, 2001, now Pat. No. 6,730,537, application No. 11/120,352, and a continuation-in-part of application No. 10/186,297, filed on Jun. 27, 2002, now abandoned, which is a continuation-in-part of application No. 10/013,334, filed on Nov. 5, 2001, now abandoned, which is a continuation of application No. 09/085,390, filed on May 27, 1998, now abandoned.

(60) Provisional application No. 60/191,814, filed on Mar. 24, 2000, provisional application No. 60/226,720, filed on Aug. 21, 2000, provisional application No. 60/231,193, filed on Sep. 7, 2000, provisional application No. 60/047,804, filed on May 27, 1997.

(51) Int. Cl.
*G01N 33/553* (2006.01)
(52) U.S. Cl. ............................ 257/9; 436/525; 977/773; 977/810; 977/830; 257/E49.003
(58) Field of Classification Search .................... 257/9, 257/E49.003; 427/2.11–2.14; 435/5, 7.1; 436/501, 523–525; 977/700, 773–775, 777, 977/810, 830; 438/1, 100–101, 800
See application file for complete search history.

(56) References Cited

U.S. PATENT DOCUMENTS 4,522,932 A    6/1985   Mitchell, III (Continued)

FOREIGN PATENT DOCUMENTS

| WO | WO 94/03496 | 2/1994 |
| WO | WO 98/53841 | 12/1998 |

OTHER PUBLICATIONS

Bartlett P. A., et al "Synthesis of Water-Soluable Undecagold CLuster Compounds of Potential Importance in Electron Microscopic and Other Studies of Biological Systems." J. Am. Chem. Soc., vol. 100, No. 16 (Aug. 2, 1978): pp. 5085-5089.*

(Continued)

*Primary Examiner*—Douglas M Menz
*Assistant Examiner*—Matthew W Such
(74) *Attorney, Agent, or Firm*—Klarquist Sparkman, LLP

(57) ABSTRACT

A method for forming arrays of metal, alloy, semiconductor or magnetic nanoparticles is described. An embodiment of the method comprises placing a scaffold on a substrate, the scaffold comprising, for example, polynucleotides and/or polypeptides, and coupling the nanoparticles to the scaffold. Methods of producing arrays in predetermined patterns and electronic devices that incorporate such patterned arrays are also described.

31 Claims, 17 Drawing Sheets

U.S. PATENT DOCUMENTS

| | | | |
|---|---|---|---|
| 5,082,627 | A | 1/1992 | Stanbro |
| 5,156,810 | A | 10/1992 | Ribi |
| 5,242,877 | A | 9/1993 | Dobson et al. |
| 5,360,895 | A * | 11/1994 | Hainfeld et al. .......... 530/391.5 |
| 5,389,401 | A | 2/1995 | Gordon |
| 5,521,289 | A * | 5/1996 | Hainfeld et al. .......... 530/391.5 |
| 5,536,858 | A | 7/1996 | Lalonde et al. |
| 5,578,248 | A | 11/1996 | Hattori et al. |
| 5,629,213 | A | 5/1997 | Kornguth et al. |
| 5,770,417 | A | 6/1998 | Vacanti et al. |
| 5,952,172 | A | 9/1999 | Meade et al. |
| 5,952,472 | A | 9/1999 | Hanai et al. |
| 6,121,425 | A | 9/2000 | Hainfeld et al. |
| 6,147,159 | A | 11/2000 | Hu et al. |
| 6,159,620 | A | 12/2000 | Heath et al. |
| 6,197,575 | B1 | 3/2001 | Griffith et al. |
| 6,730,537 | B2 | 5/2004 | Hutchison et al. |
| 6,818,418 | B1 | 11/2004 | Lipovsek et al. |
| 6,872,971 | B2 | 3/2005 | Hutchison et al. |
| 2002/0146742 | A1 | 10/2002 | Wybourne et al. |

OTHER PUBLICATIONS

Giersig, M. and Mulvaney, P. "Preparation of Ordered Colloid Monolayers by Electrophoretic Deposition." Langmuir, vol. 9 (1993): pp. 3408-3413.*

Alivisatos et al., "Organization of 'Nanocrystal Molecules' using DNA" *Nature* 285:609-611, 1996.

Andres et al., "'Coulomb Staircase' at Room Temperature in a Self-Assembled Molecular Nanostructure" *Science* 273:1690-1693, 1996.

Andres et al., "Self-Assembly of a Two-Dimensional Superlattice of Molecularly Linked Metal Clusters" *Science* 273:1690-1693, 1996.

Bain et al., "Formation of Monolayer Films by the Spontaneous Assembly of Organic Thiols from Solution onto Gold" *J. Am. Chem. Soc.* 111:321-335, 1989.

Bartlett et al., "Synthesis of Water-Soluble Undecagold Clusters Compounds of Potential Importance in Electron Microscopic and Other Studies of Biological Systems" *J Am. Chem. Soc.* 100:5085-5089, 1978.

Braun et al., "DNA-Templated Assembly and Electrode Attachment of a Conducting Silver Wire" *Nature* 391:775-778, 1998.

Brown and Hutchison, "Convenient Preparation of Stable, Narrow-Dispersity, Gold Nanocrystals by Ligand Exchange Reactions" *J. Am. Chem. Soc.* 119:12384-12385, 1997.

Brust et al., "Novel Gold-Dithiol Nano-Networks with Non-Metallic Electronic Properties" *Adv. Mater.* 7:795-797, 1995.

Clarke et al., "Fabrication and Near-Room Temperature Transport of Patterned Gold Cluster Structures" *J. Vac. Sci. Technol. B* 15:2925-2929, 1997.

Feldheim et al., "Electron Transfer in Self-Assembled Inorganic Polyelectrolyte/Metal Nanoparticle Heterostructures" *J. Am. Chem. Soc.* 118:7640-7641, 1996.

Geerligs et al., "Frequency-Locked Turnstile Device for Single Electrons" *Phys. Rev. Lett.* 64:2691-2694, 1990.

Grabar et al., "Preparation and Characterization of Au Colloid Monolayers" *Anal. Chem.* 67:735-743, 1995.

Itou, "Reorientation of Poly-γ-Benzyl L-Glutamate Liquid Crystals in an Electric Field" *Jpn. J. Appl. Phys.* 24:1234-1235, 1985.

Likharev, "Correlated Discrete Transfer of Single Electrons in Ultrasmall Tunnel Junctions" *IBM J. Res. Div.* 32:144-158, 1988.

Mao et al., "Designed Two-Dimensional DNA Holliday Junction Arrays Visualized by Atomic Force Microscopy" *J. Am. Chem. Soc.* 121:5437-5443, 1999.

Mirkin et al., "A DNA Based Method for Rationally Assembling Nanoparticles into Macroscopic Materials" *Nature* 382:607-609, 1996.

Niemeyer, "DNA as a Material for Nanotechnology" *Angew. Chem. Int. Ed. Engl.* 36:585-587, 1997.

O'Konski et al., "Electric Properties of Macromolecules. IV. Determination of Electric and Optical Parameters from Saturation of Electric Birefringence in Solutions" *J. Phys. Chem.* 63:1558-1565, 1959.

Osifchin et al., "Synthesis of a Quantum Dot Superlattice using Molecularly Linked Material Clusters" *Superlattices and Microstructures* 18:283-189, 1995.

Peschel and Schmid, "First Steps Towards Ordered Monolayers of Ligand-Stabilized Gold Clusters" *Angew Chem. Int. Ed. Engl.* 34:1442-1443, 1995.

Pothier et al., "Single-Electron Pump Based on Charging Effects" *Europhys. Lett.* 17:249-254, 1992.

Qi et al., "Ligation of Triangles Built from Bulged 3-Arm DNA Branched Junctions" *J. Am. Chem. Soc.* 118:6121-6130, 1990.

Schmid, "Hexachlorododecakis(triphenylphosphine)pentapentacontagold, $Au_{55}[P(C_6H_5)_3]_{12}Cl_6$" *Inorg. Syn.* 27:214-218, 1990.

Schöll and Simon, "A Fascinating New Field in Colloid Science: Small Ligand-Stabilized Metal Clusters and their Possible Application in Microelectronics" *Colloid Polym. Sci.* 273:202-218, 1995.

Seerman, "DNA Components for Molecular Architecture" *Accounts of Chemical Research* 30:357-363, 1997.

Simon et al., "The Application of $Au_{55}$ Clusters and Quantum Dots" *Angew. Chem. Int. Ed. Engl.* 32:250-254, 1993.

Storhoff and Mirkin, "Programmed Materials Synthesis with DNA" *Am. Chem. Soc.* 99:1849-1862, 1999.

Templeton et al., "Gateway Reactions to Diverse, Polyfunctional Monolayer-Protected Gold Clusters" *J. Am. Chem. Soc.* 120:4845-4849, 1998.

Whitesell et al., "Directionally Aligned Helical Peptides on Surfaces" *Science* 261:73-76, 1993.

Winfree et al., "Design and Self-Assembly of two-Dimensional DNA Crystals" *Nature* 394:539-544, 1998.

Woehrle et al., Abstract entitled "Synthesis of subnanometer water-soluble thiol-stabilized nanoparticles by ligand exchange reactions" published on the internet, circa Jun. 14, 2001.

Woehrle et al., "Ligand Exchange Reactions Yield Subnanometer, Thiol-Stabilized Gold Particles with Defined Optical Transitions" *J. Phys. Chem. B* 106:9979-9981, 2002.

Wybourne et al., "Coulomb-Blockade Dominated Transport in Pattered Gold-Cluster Structures" *Jpn. J. Appl. Phys.* 36:7796-7780, 1997.

Yano et al., "Transport Characteristics of Polycrystalline-Silicon Wire Influenced by Single-Electron Charging at Room Temperature" *Appl. Phys. Lett.* 67:828-830, 1995.

International Search Report from International Application No. PCT/US03/20500 dated Dec. 11, 2003.

* cited by examiner

SCAFFOLD-ORGANIZED CLUSTERS AND ELECTRONIC DEVICES MADE USING SUCH CLUSTERS

CROSS REFERENCE TO RELATED APPLICATIONS

This application is a continuation-in-part of U.S. application Ser. No. 11/094,049, filed Mar. 29, 2005, now U.S. Pat. No. 7,442,573 which is a divisional of U.S. application Ser. No. 10/783,515, filed Feb. 19, 2004, and now issued as U.S. Pat. No. 6,872,971, which is a divisional application of U.S. application Ser. No. 09/817,708, filed Mar. 26, 2001, which issued as U.S. Pat. No. 6,730,537, which claims the benefit of prior U.S. provisional application Nos. 60/191,814, filed Mar. 24, 2000, entitled Scaffold-Organized Metal, Alloy, Semiconductor and/or Magnetic Clusters and Electronic Devices Made Using Such Clusters; 60/226,720, filed on Aug. 21, 2000, entitled Scaffold Organized Clusters; and 60/231,193, filed Sep. 7, 2000, entitled Scaffold Organized Clusters. This application also is a continuation-in-part of U.S. application Ser. No. 10/186,297, filed Jun. 27, 2002 now abandoned which is a continuation-in part of U.S. patent application Ser. No. 10/013,334, filed Nov. 5, 2001, now abandoned which is a continuation of U.S. patent application Ser. No. 09/085,390, filed May 27, 1998, now abandoned, which claims the benefit of U.S. Provisional Application No. 60/047,804, filed May 27, 1997. Each of these prior applications is incorporated herein by reference.

ACKNOWLEDGEMENT OF GOVERNMENT SUPPORT

This invention was made with government support under Grant No. DMR 9705343 awarded by the National Sciences Foundation. The government has certain rights in the invention.

FIELD

This application concerns forming metal, alloy, semiconductor and/or magnetic nanoparticles, and arrays of such nanoparticles, for use in the manufacture of electronic devices, such as high-density memory storage and nanoelectronic devices.

BACKGROUND

Fundamentally new technologies are required to continue increasing device integration density and speed. Conventional metal-oxide-semiconductor-field-effect transistors soon will reach fundamental density and speed limits as a result of quantum mechanical tunneling. To scale electronic devices down to nanometer dimensions, fundamentally distinct new technologies are needed to provide smaller features that can confer heretofore unattainable electron flow control. The ultimate limit is a system in which the transfer of a single charge quantum corresponds to information transfer or some type of logic operation. Such single-electron systems are presently the focus of intense research activity. See, for example, *Single Charge Tunneling, Coulomb Blockade Phenomena in Nanostructure*, edited by H. Grabert and M. H. Devoret, NATO ASI Series B: Physics Vol. 294 (1992). These systems have potential application to nanoelectronic circuits that have integration densities far exceeding those of present day semiconductor technology. See, *Quantum Transport in Ultrasmall Devices*, edited by D. K. Ferry, H. L. Grubin, C. Jacoboni, and A. Jauho, NATO ASI Series B: Physics Vol. 342 (1995).

Single-electron transistors based on the concept of Coulomb blockade are one proposed technology for realizing ultra-dense circuits. K. K. Likharev, Single-electron Transistors: Electrostatic Analogs of the DC SQUIDS, *IEEE Trans. Magn.* 1987, 23, 1142; and *IBM J. Res. Dev.* 1988, 32, 144-158. Coulomb blockade is the suppression of single-electron tunneling into metallic or semiconductor islands. In order to achieve Coulomb blockade, the charging energy of an island must greatly exceed the thermal energy. To reduce quantum fluctuations the tunneling resistance to the island should be greater than the resistance quantum $h/e^2$. Coulomb blockade itself may be the basis of conventional logic elements, such as inverters. Id.

Equally promising is the fact that the Coulomb blockade effect can be used to pump charges one-by-one through a chain of dots to realize a frequency-controlled current source in which the current is exactly equal to I=ef, where f is the clocking frequency. See, L. J. Geerligs et al. Frequency-locked Turnstile Device for Single-electrons, *Phys. Rev. Lett.* 1990, 64, 2691; and H. Pothier et al. Single-Electron Pump Based on Charging Effects, *Europhys. Lett.* 1992, 17, 249. Such turnstile devices are of fundamental interest as highly accurate current standards.

The clocking of charge through an array is also one model of information storage. It is possible that computation may be based on switching of currents rather than charge, which, due to the extreme accuracy of single-electron current sources, may be more robust towards unwanted fluctuations than single-electron transistor-based circuits.

One of the most promising technologies for realizing terabyte memories is founded on the principle of the Coulomb blockade. Yano et al. have demonstrated room temperature operation of single-electron devices based on silicon nanocrystals embedded in $SiO_2$. K. Yano et al. Room-Temperature Single-electron Memory, *IEEE Trans. Electron. Devices,* 1994, 41, 1628; and K. Yano et al. Transport Characteristics of Polycrystalline-Silicon Wire Influenced by Single-electron Charging at Room Temperature, *Appl. Phys. Lett.* 1995, 67, 828. Recently, a fully integrated 8×8 memory array using this technology has been reported. K. Yano et al. Single-Electron-Memory Integrated Circuit for Giga-to-Tera Bit Storage, *IEEE International Solid State Circuits Conference,* 1996, 266-267.

Microelectronic devices based on the principle of Coulomb blockade have been proposed as a new approach to realizing electronic circuits or memory densities that go beyond the predicted scaling limit for present day semiconductor technology. While the operation of Coulomb blockade devices has been demonstrated, most operate only at greatly reduced temperatures and require sophisticated nanofabrication procedures. The size scales necessary for Coulomb blockade effects at such relatively elevated temperatures of about room temperature impose limits on the number, uniformity and connectivity of quantum dots. As a result, alternative methodologies of nanofabrication need to be investigated and developed.

Gold nanoparticles have been used for purposes other than as disclosed herein, for example, as molecular probes for imaging biological systems. For example, U.S. Pat. No. 5,521,289 to Hainfeld et al. (Hainfeld) is "directed to small organometallic probes." These probes are described at column 2, line 26, as comprising "metal cluster compounds." At line 31, Hainfeld describes the compounds as, "organothiol metal clusters, wherein the metal core is comprised of gold, platinum, silver, palladium or combinations of these metals." The patent describes "organometallic clusters or colloids . . . which are covalently bonded to antibodies, antibody fragments, avidin or streptavidin, peptides, drugs, antigens, DNA, RNA, or other biological molecules, so as to form organometallic probes." Hainfeld, column 2, lines 50-55.

Phosphine-stabilized undecagold nanoparticles have been prepared previously. For example, Bartlett et al. describe the synthesis of two water-soluble, triarylphosphine-stablilized undecagold particles. *J. Am. Chem. Soc.* 1978, 100, 5085-5089 (Bartlett). Bartlett also proposes that the cluster could be used, "[f]or electron microscopic purposes." Page 5087, column 2.

Monolayers of colloidal and nanoparticle materials have been prepared. For example, preparations of "two-dimensional arrays of colloidal Au particles" are known. Grabar et al. *Anal. Chem.* 1995, 67, 735-743 (Grabar). Grabar describes linking colloidal Au particles, "in the 5-70 nm size range," to glass and quartz surfaces via "[h]ydroxyl/oxide groups on the substrate surface." Page 738, column 2.

Another reference discloses "close-packed planar arrays of nanometer-diameter metal clusters," Andres et al. *Science*, 1996, 273, 1690-1693 (Andres). Andres describes gas phase synthesis of gold nanocrystals, which are "captured by contact with a fine spray of organic solvent and surfactant. The spray droplets are subsequently removed from the gas stream and collected." Andres, p. 1691, column 3. Andres describes "spin casting a dilute suspension of uniform diameter, alkylthiol-encapsulated gold clusters in mesitylene on various flat substrates," at page 1692, column 1. Andres includes a TEM micrograph of "3.7 nm gold clusters supported on a thin flake of $MoS_2$," at page 1692, column 2. The publication goes on to describe displacement of the dodecane thiol molecules from the clusters using aryl dithiols and aryl di-isonitriles.

SUMMARY

The present disclosure encompasses nanoparticles, preparation of nanoparticles and arrays comprising nanoparticles. Nanoparticles may be formed of metal, alloy, semiconductor and/or magnetic nanoparticle materials. "Nanoparticles" as used herein refers to more than one, and typically three or more, metal, alloy, semiconductor or magnetic atoms coupled to one another by metal-type bonds or ionic bonds. Nanoparticles are intermediate in size between single atoms and colloidal materials. Nanoparticles are so termed because the radius of each such nanoparticle is on the order of about one nanometer.

An "array" is an arrangement of plural such nanoparticles spaced suitably for forming electronic components or devices. The spacing should be such as to allow for electron tunneling between nanoparticles of the array. Examples include lower order arrays, such as one-dimensional arrays, one example of which comprises plural nanoparticles arranged substantially linearly. Plural such arrays can be organized, for example, to form higher order arrays, such as a junction comprising two or more lower order arrays. A higher order array also may be formed by arranging nanoparticles in two or three dimensions, such as by coupling plural nanoparticles to two- or three-dimensional scaffolds, and by combining plural lower order arrays to form more complex patterns, particularly patterns useful for forming electronic devices.

An important goal is to provide electronic devices that operate at or about room temperature. This is possible if the nanoparticle size is made small enough to meet Coulomb blockade charging energy requirements at room temperature. While nanoparticle size itself is not dispositive of whether the nanoparticles are useful for forming devices operable at or about room temperature, nanoparticle size is nonetheless quite important. It currently is believed that nanoparticles having diameters much larger than about five nanometers likely will not be useful for forming electronic devices that operate at or about room temperature.

The metal, alloy, semiconductor and/or magnetic nanoparticles may be coupled, e.g., covalently or non-covalently linked to "scaffolds," to organize the nanoparticles into arrays. Non-covalent interactions suitable for linking nanoparticles to scaffolds include, coulombic, hydrophobic, and hydrogen-bonding interactions. "Scaffolds" are any molecules, including polymers that can be placed on a substrate in predetermined patterns, such as linear bridges between electrodes, and to which nanoparticles can be bonded to provide organized nanoparticle arrays. Without limitation, scaffolds include biomolecules, such as polynucleotides, including DNA and RNA, polypeptides, and mixtures thereof. Polypeptides capable of forming regular structures such as α-helices are a particularly important class of biomolecules useful as scaffold-forming molecules. Polypeptides that are capable of forming other secondary structures, such as $3_{10}$-helices, π-helices, and β-sheets also may serve as scaffolds. Polypeptides that are capable of forming repetitive higher order structures (i.e., tertiary, and quaternary structures) also may serve as scaffolds. One example is the collagen triple helix. Double stranded DNA, Holliday junctions, and RNA hairpins are non-limiting examples of polynucleotide scaffolds. Polynucleotides exhibit properties that may be exploited for use in scaffolds. For example, polynucleotides engage in predictable, sequence dependent, intermolecular interactions. Furthermore, polynucleotides engage in well-characterized chemical reactions with diverse reagents. Finally, diverse, higher order polynucleotide structures can be assembled predictably. The combination of these properties allow different nanoparticles to be arrayed predictably, such that different devices may constructed using the same scaffold.

One embodiment of a method for forming arrays of metal, alloy, semiconductor and/or magnetic nanoparticles involves placing a scaffold on a substrate, in, for example, a predetermined pattern. Arrays are formed by contacting the scaffold with plural, ligand-stabilized metal, alloy, semiconductor and/or magnetic nanoparticles that couple to the scaffold. The nanoparticles may be monodisperse or substantially monodisperse. "Substantially monodisperse" with respect to present embodiments means particles having substantially the same size. The useful conducting properties of the arrayed nanoparticles diminish if the particle size distribution comprises greater than about a 30% polydispersity calculated at two standard deviations. Thus, a collection of substantially monodisperse nanoparticles should have less than about a 30% dispersion for the purposes of present embodiments. The $Au_{11}$ nanoparticles described herein are substantially completely monodisperse, meaning that they are monodisperse as judged by all analytical techniques employed to date. If the nanoparticles are metal nanoparticles, then the metal may be selected from the group consisting of Ag, Au, Pt, Pd, Co, Fe and mixtures thereof. If gold is the metal, the metal nanoparticle may have a diameter of from about 0.7 nm to about 5 nm. Particular working examples comprise nanoparticles having average diameters of about 1.41-1.5 nm, which traditionally have been referred to as $Au_{55}$ nanoparticles. Additional working examples employ $Au_{11}$ nanoparticles, which have a diameter of about 0.8 nm.

Nanoparticles may be coupled to a scaffold. In some embodiments, nanoparticles may be coupled to scaffolds by ligand exchange reactions. In such situations, a nanoparticle, prior to contacting the scaffold, typically includes at least one, and more commonly, plural exchangeable ligands bonded thereto. The ligand exchange reactions involve exchanging functional groups of the scaffold for at least one of the exchangeable ligands of the nanoparticle that is present prior to contacting the scaffold with the nanoparticles. Examples of exchangeable ligands suitable for forming metal nanoparticles may be selected from the group consisting of sulfur-bearing compounds, such as thiols, thioethers (i.e., sulfides), thioesters, disulfides, and sulfur-containing heterocycles; selenium bearing molecules, such as selenides; nitrogen-bearing compounds, such as 1°, 2° and perhaps 3° amines, aminooxides, pyridines, nitriles, and hydroxamic acids; phosphorus-bearing compounds, such as phosphines; and oxygen-bearing compounds, such as carboxylates, hydroxyl-bearing compounds, such as alcohols, and mixtures thereof. Particularly effective ligands for metal nanoparticles may be selected from compounds bearing elements selected from the group consisting of oxygen, sulfur, selenium and tellurium. Members of this group are generally termed "chalcogens." Of the chalcogens, sulfur is a particularly suitable ligand, and molecules comprising sulfhydryl (HS—) moieties are particularly useful ligands for stabilizing metal nanoparticles.

Nanoparticles also may be coupled to the scaffold by linker molecules. In one embodiment, the linker molecule comprises a single functional group capable of reacting twice, once with the nanoparticle and once with the scaffold. An example would be the formation of a thioether or disulfide. Alternatively, the linker molecule could include two functional groups, represented by a formula such as X—Y, where X is a ligand functional group that coordinates to the nanoparticle, and Y is a functional group that interacts, either covalently or noncovalently, with the scaffold. In still another embodiment, the linker molecule would comprise a bifunctional linker molecule, such as a linker molecule comprising a ligand functional group, a spacer group, and a functional group selected to interact with the scaffold. The ligand functional group may be selected from the group of ligands described above, and the functional group may comprise a reactive functional group suitable for forming a covalent bond to the scaffold or a group for non-covalent binding to the scaffold. The spacer group may comprise any group that confers the desired scaffold-nanoparticle or nanoparticle-nanoparticle spacing. Particular spacer groups comprise aliphatic groups, such as alkyl chains. Particular reactive functional groups include those selected from the group consisting of electrophilic moieties, such as aldehydes, ketones, and activated carboxylic acid derivatives; nucleophilic moieties, such as amines, aminooxides, hydrazides, semicarbazides, thiosemicarbazides, and combinations thereof. In one embodiment the functional group is an activatable C—H bond. Nanoparticles may be non-covalently linked to the scaffold by molecular recognition events. For example, antibodies or other biomolecules that can selectively bind the scaffold may be attached to a ligand molecule.

Nanoparticles also may be coupled to the scaffold by other non-covalent interactions, such as electrostatic interactions between the nanoparticle and the scaffold. For example, nanoparticles may include plural ligands that possess a charge or charges, either positive or negative, that serve to attract the nanoparticles to oppositely charged scaffolds. In one embodiment, the nanoparticle includes ligands having at least one positive charge and the scaffold is a polynucleotide having plural negative charges along its phosphate backbone. In a more particular embodiment, the nanoparticle includes ligands having quaternary ammonium groups. In another embodiment, the nanoparticle includes ligands with at least one negative charge, such as ligands having carboxylate or sulfonate group(s), and the scaffold is a polypeptide, such as polylysine (PL), having plural positive charges. In a particular disclosed embodiment, the scaffold is poly-L-lysine (PLL).

Nanoparticles may be coupled to a scaffold through hydrophobic interactions. In one embodiment, the nanoparticle includes ligands with a portion that can intercalate into a scaffold, such as a polynucleotide. Such ligands can engage in analogous hydrophobic interactions with peptide scaffolds. For example, the portion may be an anthraquinone. Other examples of suitable intercalating portions include planar cations, such as acridine orange, ethidium, and proflavin. In some embodiments, the portion facilitates intercalation at particular, sequence-specific sites within a DNA molecule. In other embodiments the nanoparticles are coupled to a scaffold through covalent bonds between the ligands of the nanoparticle and the scaffold.

There are several methods for placing a scaffold onto a substrate in predetermined patterns. For example, one method comprises aligning scaffold molecules in an electric field created between electrodes on the substrate. It therefore will be appreciated that the scaffold molecules advantageously may have a dipole moment sufficient to allow them to align between the electrodes. This is one reason why polypeptides that form α-helices currently are deemed particularly useful. The α-helix structure imparts a sufficient dipole to the polypeptide molecules to allow alignment of the molecules between the electrodes upon formation of an electrical field. One example of a polypeptide useful for forming scaffolds is polylysine. Similarly, other scaffolds that have a net dipole, for example, certain polynucleotides, such as DNA or RNA polynucleotides, may be aligned by electric fields.

Another method of patterning scaffold molecules comprises polymerizing monomers, oligomers (10 amino acids or nucleotides or less), or small polynucleotides or polypeptides into longer molecules on the surface of a substrate. For example, scaffold molecules can be polymerized as a bridge between electrodes on a substrate.

Yet another method of placing a scaffold onto a substrate in a predetermined pattern is by anchoring the scaffold and inducing alignment of the anchored scaffold in a particular direction by fluid flow. For example, a scaffold may be aligned between two electrodes by attaching the scaffold to a first electrode and using fluid flow in the direction of a second electrode to align the scaffold with the direction between the two electrodes. In a particular embodiment, the substrate is mica, the scaffold is DNA, and the DNA is attached to the first electrode using a thiol linkage. Fluid-induced alignment is used to align the scaffold in the direction of the second electrode, and the DNA scaffold is bound to the mica substrate by $Mg^{2+}$ ions, thereby holding the DNA in its aligned position. Fluid-induced alignment also may be subsequently used to align additional scaffolds so that they cross, or intersect scaffolds already aligned on the substrate.

Other methods of placing a scaffold onto a substrate in a predetermined pattern include related chemical approaches, such as functional group-directed assembly between two attachment points on the substrate, and selective unmasking of a scaffold or a scaffold functional group by a method such as photolithography. Another option is an approach using physical manipulation of a scaffold, such as positioning the scaffold on a substrate using magnetic fields, optical tweezers, or laser traps.

Multiple scaffolds bearing nanoparticles may be arranged on a substrate using any of the above methods. Alternatively, the scaffold can be first deposited on a substrate, and subsequently coupled to a nanoparticle. In either approach, scaffolds can be aligned between electrodes, and also may be aligned such that they cross or otherwise contact each other to form one-, two- or three-dimensional structures useful as templates for forming electronic devices comprising nanoparticle arrays. Such nanoparticle arrays may be used to provide high density electronic or memory devices that operate on the principle of Coulomb blockade at ambient temperatures.

Useful compositions for forming metal, alloy, semiconductor and/or magnetic nanoparticle arrays are provided below. In a particular embodiment, the composition comprises substantially monodisperse, ligand-stabilized 1.4-1.5 nm diameter metal nanoparticles coupled to a polypeptide in the shape of or capable of forming an α-helix with the metal nanoparticles bonded thereto. In another embodiment, the composition comprises substantially monodisperse, ligand-stabilized, gold metal nanoparticles coupled to a polynucleotide capable of forming a helical structure. Particular embodiments provide organized arrays of metal nanoparticles comprising monodisperse, ligand-stabilized metal nanoparticles having metal-nanoparticle diameters of from about 0.7 nm to about 5 nm, the metal being selected from the group consisting of Ag, Au, Pt, Pd, Co, Fe and mixtures thereof. More typically, the nanoparticle diameters range from about 0.7 nm to about 2.0 nm, and working embodiments employ nanoparticles ranging from about 0.8 nm to about 1.5 nm. Such arrays include a scaffold and the metal nanoparticles are coupled to the scaffold to form the organized array.

Compositions comprising polynucleotides capable of forming ordered structures, particularly helical structures, and plural, monodisperse, ligand-stabilized metal and/or semiconductor nanoparticles, where each nanoparticle having plural ligands serves to couple the nanoparticles to the polynucleotide, also are provided. The plural ligands of the nanoparticles may serve to interact and couple the nanoparticle to the polynucleotide through interactions such as ligand exchange reactions, electrostatic interactions, hydrophobic interactions, intercalative interactions and combinations thereof.

The distance between nanoparticles can be important for controlling the electronic properties of an array of nanoparticles. For example, electron tunneling decays exponentially with distance between nanoparticles. Generally, the scaffold and the nanoparticle ligands define the nanoparticle separation. The scaffold can define the maximum separation of one nanoparticle from a second, and the ligands can define the minimum possible separation of the nanoparticles. For useful tunneling between nanoparticles, the spacing between nanoparticles is provided by ligands comprising a chain typically having from about 2 to about 20 methylene units, with more typical embodiments having the spacing provided by ligands comprising a chain having from about 2 to about 10 methylene units. Other ligands that yield closely packed nanoparticles, e.g. those that provide an inter-nanoparticle distance of from about 5 Å to about 30 Å, are suitable for making electronic devices. Given the inverse exponential dependence of the electron tunneling rate on the interparticle spacing, particles that are not closely packed may not be important for charge transport.

Electronic devices based on the Coulomb blockade effect also are described that are designed to operate at or about room temperature. Such electronic devices include a first nanoparticle (e.g. a nanoparticle comprising a metal nanoparticle core having a diameter of between about 0.7 nm and about 5 nm) and a second such nanoparticle. The nanoparticles are physically spaced apart from each other at a distance of less than about 5 nm by coupling the nanoparticles to a scaffold, such as a biomolecular scaffold, so that the physical separation between the nanoparticles is maintained.

Devices may be manufactured by taking advantage of the well-defined location of various chemical moieties on particular scaffolds in combination with chemoselective coupling techniques. Thus, different nanoparticle types having different electronic properties and bearing different functional groups can be placed at a particular predetermined location on a scaffold. Particular device features include conductors, inductors, transistors, and arrays of such features; such as to form logic gates and memory arrays.

Electronic devices also may include pairs of biomolecular scaffolds, each with coupled nanoparticles, arranged so that the scaffolds intersect to provide electric circuit elements, such as single-electron transistors and electron turnstiles. Such elements may be useful as components of chemical sensors or ultrasensitive electrometers. A device, for example a single electron transistor, can comprise linear chains of substantially similar nanoparticles, or can comprise a single nanoparticle electrically coupled to larger particles or electrodes. In such a device, a single nanoparticle can dominate the electronic characteristics of the device. Because of their unique architecture, electronic devices comprising the nanoparticles described herein exhibit a linear increase in the number of electrons passing between pairs of nanoparticles as the potential difference between the two nanoparticles is increased above a threshold value.

Certain described embodiments of the method relate to forming substantially monodisperse, phosphine-stabilized gold nanoparticles that allow the radii of nanoparticles to be controllably adjusted. One described embodiment comprises dissolving $HAuCl_4$ and $PPh_3$ in a biphasic system (for example, a biphasic system comprising a water phase, an organic phase, and a phase transfer catalyst) and adding sodium borohydride to the biphasic system. In particular embodiments, the biphasic system may comprise water and an organic solvent, typically an aromatic solvent, such as may be selected without limitation from the group consisting of toluene, xylenes, benzene, furan, and mixtures thereof. The phase transfer catalyst may be any known or future developed suitable catalyst. Working embodiments typically used nitrogen-charged species, such as quaternary ammonium salts, for example, tetraoctylammonium bromide. The nanoparticle size can be determined by controlling the rate of sodium borohydride addition to the biphasic system.

Distinct procedures for preparing thiol-stabilized gold nanoparticles from phosphine-stabilized nanoparticles have been developed for both $Au_{11}$ nanoparticles and 1.4 nm diameter particles. Particles that are particularly useful for preparing arrays are prepared from thiol ligands that comprise a group or groups of atoms that are capable of coupling thiol-stabilized gold nanoparticle to scaffolds. Phosphine and thiol ligands may be prepared in a single-phase system if the thiol ligand is soluble in an organic solvent. However, if the thiol ligand is water soluble, it is still possible to exchange thiol ligands for phosphine ligands at the interface between a water-immiscible organic solvent containing the phosphine-stabilized gold nanoparticles and water or an aqueous composition comprising the thiol ligand.

DETAILED DESCRIPTION

Abbreviations and Definitions

Figure 1:
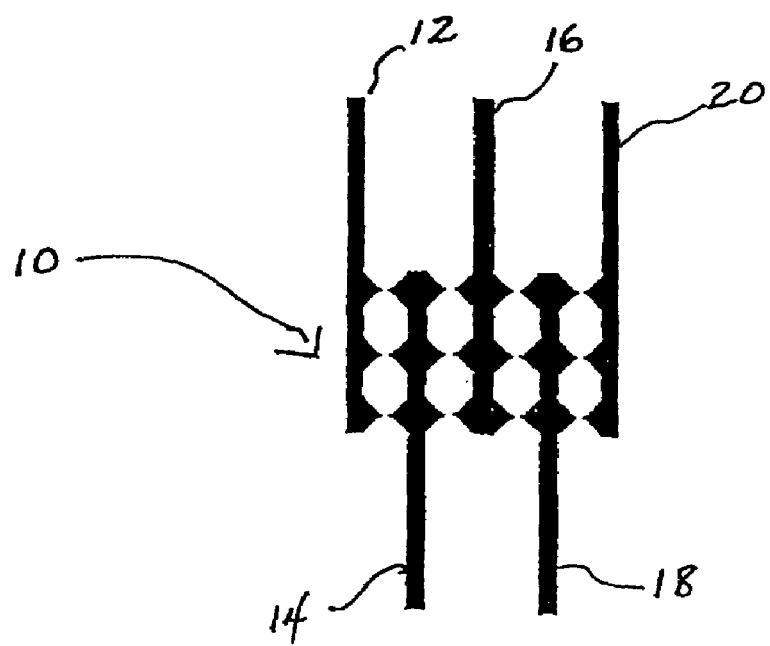
FIG. 1 is a schematic diagram of an interdigitated electrode array having saw-tooth edges.

The following abbreviations and definitions are provided to facilitate the reader's understanding of the present invention but not to define terms to have a scope narrower than would be understood by a person of ordinary skill in the art. The singular forms "a," "an," and "the" refer to one or more unless the context clearly indicates otherwise.
PL—polylysine
PLL—poly-L-lysine
AFM—atomic force microscopy
TEM—transmission electron microscopy
SEM—scanning electron microscopy
PMMA—polymethyl methacrylate
XPS—X-ray photoelectron spectroscopy
ODT—octadecylthiol
TOABr—tetraoctylammonium bromide An overview of the process used to produce organized arrays comprising metal, alloy, semiconductor and/or magnetic nanoparticles includes (1) coupling molecular scaffolds to substrates, generally a metal, glass or semiconductor material, in predetermined patterns, (2) forming substantially monodisperse, relatively small (Coulomb blockade effects are dependent upon nanoparticle size, e.g., metal particles having a diameter, $d_{core}$ of less than about 2 nm exhibit Coulomb blockade behavior at room temperature) ligand-stabilized metal, alloy, semiconductor and/or magnetic nanoparticles, (3) coupling the ligand-stabilized nanoparticles to the scaffolds to form organized arrays, (4) coupling electrical contacts to the organized arrays, and (5) using such constructs to form electronic, particularly nanoelectronic, devices. Alternatively, nanoparticles can be coupled to scaffolds prior to coupling the scaffolds to substrates.

Certain of the following passages therefore describe how to make and use devices based on metal nanoparticle arrays. Unless expressly stated otherwise, or the context indicates differently, it should be understood that any reference in this application to "metal nanoparticles" or "nanoparticles" typically refers to metal nanoparticles, alloy nanoparticles, semiconductor nanoparticles, magnetic nanoparticles, and combinations thereof.

Important features of the present method include, both individually and in combination, the small physical size of the metal nanoparticles, the substantial monodispersity or monodispersity of the nanoparticles, the ligand exchange chemistry and/or the nature of the ligand shell produced by the ligand exchange chemistry. The small physical size of the metal nanoparticles provides a large Coulomb charging energy. The ligand-exchange chemistry provides a means to tailor the ligand shell for a particular purpose and immobilize the nanoparticles on biomolecules. And, the ligand shell offers a uniform and chemically adjustable tunnel barrier between nanoparticle cores.

The following paragraphs describe particular embodiments and applications in greater detail.

I. Forming Substantially Monodisperse Ligand-Stabilized Nanoparticles

A feature of the present application is the recognition that substantially monodisperse, relatively small metal nanoparticles can be used to develop electronic devices that operate at or about room temperature based on the Coulomb blockade effect. "Monodisperse" refers to the formation of a population of metal nanoparticles of substantially the same size, i.e., having substantially the same radii (or diameters). In contrast, prior-art approaches typically have used polydisperse metal nanoparticles where the size of the metal nanoparticles is not substantially uniform. A completely monodisperse population is one in which the size of the metal nanoparticles is identical as can be determined by currently used characterization procedures. However, complete monodispersity is difficult, if not impossible, to achieve in most sizes of nanoparticles. Although complete monodispersity is not required to produce devices operating at room temperature based on the Coulomb blockade effect, as the dispersity of the nanoparticle population proceeds from absolute monodispersity towards polydispersity the likelihood that the device will operate reliably at room temperature, based on the Coulomb blockade effect, decreases. For example, $Au_{11}$ nanoparticles prepared as described herein are virtually completely monodisperse. However, 1.4-1.5 nm diameter gold nanoparticles are not as monodisperse as undecagold particles, which have a diameter of about 0.8 nm. Moreover, as the radius of the metal nanoparticle decreases, the intrinsic capacitance gets smaller. As capacitance gets smaller, the charging energy of the nanoparticle gets larger. Coulomb blockade effects are observed when the charging energy exceeds the thermal energy at room temperature. Prior approaches have used nanoparticles that are generally larger than would be useful for forming devices that operate at room temperature based on the Coulomb blockade effect. In contrast, the present method forms metal "nanoparticles" having relatively small diameters. The size requirement for nanoparticles made in accordance with the present method can be established in at least two ways: (1) by stating absolute diameters; and (2) by comparing the diameter of the nanoparticle in question to the diameter of gold nanoparticles having magic numbers (see the discussion provided below) of gold atoms.

In terms of diameters, "nanoparticle" is defined herein as having a diameter of from about 0.7 nm to about 5 nm (7 Å to about 50 Å), for example, from about 0.7 nm to about 2.5 nm (7 Å to about 25 Å), and more typically from about 0.8 nm to about 2.0 nm (8 Å to about 20 Å). Particular embodiments used nanoparticles having 1.4-1.5 nm diameters, and other embodiments use $Au_{11}$ nanoparticles having a diameter of about 0.8 nm. These parameters refer solely to the diameter of the metal nanoparticle, and not the diameter of the metal nanoparticle and ligand sphere.

With its insulating ligand shell, the diameter of the ligand-stabilized metal nanoparticle can vary. The size of the ligand shell may influence the electron-tunneling rate between nanoparticles. Tunneling rate is exponentially related to the thickness of the ligand shell. As a result, the diameter of the ligand shell may be tailored for a particular purpose. It currently is believed that the diameters for ligand-stabilized nanoparticles useful for preparing electronic devices should be from about 0.8 nm to about 5 nm. The relatively large metal nanoparticles made previously do not provide a sufficiently large Coulomb charging energy to operate at room temperature. Instead, prior known materials generally only operate at temperatures of from about 50 mK to about 10K.

"Bare" nanoparticles, i.e., those without ligand shells, also may be useful for preparing particular embodiments of electrical devices. For example, bare nanoparticles can be used to form electrical contacts.

Still another consideration is the distance between the edges of metal nanoparticle cores. It currently is believed that the maximum distance between the edges of nanoparticle cores for useful nanoparticles is about 5 nm (50 Å), and ideally is on the order of from about 1 to about 2 nm (10-20 Å).

Originally it was believed that useful nanoparticles generally should include numbers of atoms that are based on the so-called "geometric magic numbers" of atoms surrounded by a ligand shell. Geometric magic numbers result from the most densely packed arrangement of atoms that form a "sphere." Magic numbers are given by Formula 1 below $$1 + \sum_{n=1}^{k} (10n^2 + 2) \quad \text{Formula 1}$$

where k is an integer that represents the number of shells of metal atoms surrounding a central atom. Noble metal nanoparticles with k=2, 4, 6, 7 and 8 have been synthesized and stabilized by a ligand shell. While nanoparticles having magic numbers of atoms will work, it has now been determined that magic numbers of atoms are not required to provide useful nanoparticles. For example, nanoparticles having 11 gold atoms have proved particularly useful.

Solely by way of example, metals used to form ligand-stabilized metal nanoparticles may be selected from the group consisting of silver (Ag), gold (Au), platinum (Pt), palladium (Pd), cobalt (Co), iron (Fe), and mixtures thereof. "Mixtures thereof" refers to having more than one type of metal nanoparticle coupled to a particular scaffold, different metal nanoparticles bonded to different scaffolds used to form a particular electronic device, or having different elements within a nanoparticle. Thus it is possible that metal alloy nanoparticles, e.g., gold/palladium nanoparticles, can be used to form nanoparticle arrays and electronic devices.

Gold is a particularly useful metal for forming ligand-stabilized monodisperse metal nanoparticles. This is because (1) the present method of ligand exchange chemistry conveniently provides well-defined products, (2) $Au_{11}$ has a diameter of about 0.8 nm and $Au_{55}$ has a diameter of about 1.4 nm, making these particles particularly useful for forming organized metal arrays that exhibit the Coulomb blockade effect at or about room temperature, and (3) it is possible to prepare nearly monodisperse gold nanoparticles without lengthy purification requirements, such as lengthy crystallization processes.

Assuming that magic numbers do provide benefit, the magic numbers of gold, palladium and platinum atoms are 13, 55, 147 and 309. The magic number 55 is a particularly suitable magic number (represented as $Au_{55}$, $Pd_{55}$ and $Pt_{55}$). The magic number of silver atoms for useful silver metal nanoparticles may be the same as for gold.

Nanoparticles comprising semiconductor materials also may be useful for preparing electronic devices. Semiconductor materials that may be prepared as nanoparticles and stabilized with ligand spheres include, without limitation, cadmium selenide, zinc selenide, cadmium sulfide, cadmium telluride, cadmium-mercury-telluride, zinc telluride, gallium arsenide, indium arsenide and lead sulfide.

Magnetic particles also may be used to decorate scaffolds to provide structures having useful properties. An example, without limitation, of such magnetic particles is iron oxide ($Fe_2O_3$).

II. Ligands

A. Background

Once a suitable metal, alloy, semiconductor and/or magnetic material is selected for forming desired nanoparticles, ligands for bonding to the nanoparticles also must be selected. The assembly of nanoparticles into structures suitable for nanoelectronic applications, e.g., Coulomb blockade, involves molecular-scale organization of the nanoparticles without destroying the insulating ligand sphere between individual nanoparticles. The nanoparticles also should be coupled to the scaffold in a sufficiently robust manner to allow fabrication of devices incorporating nanoparticle arrays. This may be accomplished in certain instances by ligand exchange reactions. The selection of ligands for forming an insulating ligand layer about the nanoparticle and for undergoing ligand exchange reactions therefore is a consideration. Criteria useful for selecting appropriate ligands include, but are not limited to, (1) the ligand's ability to interact with the scaffold, such as through ligand-exchange, coulombic, intercalative, or covalent bond-forming interactions (2) solubility characteristics conferred upon the ligand-metal nanoparticle complexes by the ligand, and (3) the formation of well ordered, metal-ligand complexes having structural features that promote room temperature Coulomb-blockade effects.

B. Classes of Ligands

Ligands suitable for forming metal nanoparticles may be selected, without limitation, from the group consisting of sulfur-bearing compounds, such as thiols, thioethers, thioesters, disulfides, and sulfur-containing heterocycles; selenium bearing molecules, such as selenides; nitrogen-bearing compounds, such as 1°, 2° and perhaps 3 amines, aminooxides, pyridines, nitriles, and hydroxamic acids; phosphorus-bearing compounds, such as phosphines; and oxygen-bearing compounds, such as carboxylates, hydroxyl-bearing compounds, such as alcohols, and polyols; and mixtures thereof. Particularly effective ligands for metal nanoparticles may be selected from compounds bearing elements selected from the chalcogens. Of the chalcogens, sulfur is a particularly suitable ligand, and molecules comprising sulfhydryl moieties are particularly useful ligands for stabilizing metal nanoparticles. Additional guidance concerning the selection of ligands can be obtained from Michael Natan et al.'s Preparation and Characterization of Au Colloid Monolayers, *Anal. Chem.* 1995, 67, 735-743, which is incorporated herein by reference.

Sulfur-containing molecules (e.g., hydrogen sulfide, thiols, thioethers, thioesters, disulfides, sulfur-containing heterocycles, and mixtures thereof) comprise a particularly useful class of ligands. Thiols, for example, are a suitable type of sulfur-containing ligand for several reasons. Thiols have an affinity for gold, and gold, including gold particles, may be formed into electrodes or electrode patterns. Moreover, thiols are good ligands for stabilizing gold nanoparticles, and many sulfhydryl-based ligands are commercially available. The thiols form ligand-stabilized metal nanoparticles having a formula $M_x(SR)_n$ wherein M is a metal, R is an alkyl chain or aromatic group, x is a number of metal atoms that provide metal nanoparticles having the characteristics described above, and n is the number of thiol ligands attached to the ligand-stabilized metal nanoparticles.

C. Organic Portion of Ligands

The organic portion of useful ligands also can vary. For example, organic compounds having aliphatic groups can be used. The length of an aliphatic group can be varied to obtain particular features desired in the ligand-stabilized metal nanoparticles. These include the solubility of the metal nanoparticles, and the size and insulating characteristics of the ligand-stabilized metal nanoparticles. For example, alkyl groups having from about 2 carbon atoms to about 20 carbon atoms currently are deemed particularly suitable for forming nanoparticles soluble in organic solvents.

Aryl-type ligands, i.e., aromatic groups, such as phenyl rings, containing or having heteroatoms, such as sulfur atoms, coupled thereto, also may serve as ligands for forming ligand-stabilized metal nanoparticles. For example, mercaptobiphenyl (HS-phenyl-phenyl) has been used to form ligand-stabilized gold nanoparticles. The aromatic rings of such compounds may further include one or more functional groups capable of reacting with the scaffold molecules. For example, the aromatic rings may include one or more acidic groups, such as carboxylic acids, for coulombic interactions with functional groups of the scaffold molecules, such as amines.

Aromatic ligands are quite useful for producing rigid arrays, thereby stabilizing the electron transport properties. For this reason, aryl ligands are currently considered particularly useful ligands. Small alkyl groups, such as thiopropionic acid, also provide rigid ligand systems.

Ligands that interpose within structures, such as ligands that intercalate into scaffolds, such as nucleic acid oligomers (intercalators), also may be used to attach nanoparticles to nucleic acid oligomers. Typically, intercalators include rigid π systems. Examples of intercalators include, without limitation, anthraquinone, phenanthridinium, acridine orange, proflavin, ethidium, combinations thereof and derivatives thereof. Intercalators also may be amino acid- or nucleic acid-sequence dependent. Thus, DNA or RNA having particular sequences can be used as a scaffold that is intercalated at predetermined portions of the scaffold. This provides a method for controlling and altering the spacing between metal nanoparticles. Additional potential ligands include bifunctional linker molecules comprising a ligand group and a reactive functional group that can be used to covalently link the ligand molecule to the scaffold.

The ligands also can be inter- and/or intra-molecularly crosslinked. For example, intercalating ligands may be photo-crosslinked to the scaffold to provide more rigid systems.

Based on these considerations, a diverse family of functionalized nanoparticles has been prepared using 0.8 nm and 1.4 nm core metal nanoparticles, hereinafter abbreviated as "CORE." Ligand exchange has been used to prepare a wide variety of ligand-stabilized nanoparticles of the general formulas CORE-$[PX_3]_n$, CORE-$[S-X]_n$, and CORE-$[NHX]_n$ where X is a functional group or chemical moiety that serves to couple the nanoparticle to a scaffold, and n is at least one. For example, X may include groups capable of acid-base reactions with scaffolds, groups capable of hydrophobic interactions with scaffolds, intercalative groups, groups capable of hydrogen bonding to scaffolds, groups capable of electrostatic interactions with scaffolds, and groups capable of forming covalent bonds with a scaffold. Groups that facilitate interaction with scaffolds include, without limitation, alkyl groups from about $C_2$ to $C_{20}$, aryl groups, carboxylic acid groups, sulfonic acid groups, peptide groups, amine groups, and ammonium groups. Other functional groups that may be part of X include aldehyde groups and amide groups.

Charged species are especially useful for coulombic coupling of nanoparticles to oppositely charged scaffolds. For example, ligands having positively-charged, quaternary ammonium groups have been made that interact strongly with anionic scaffolds, such as the phosphate backbone of DNA. Ligands having negatively charged sulfonate groups have been made for interacting with positively charged scaffolds, such as poly-L-lysine.

Specific examples of functionalized nanoparticles include: phosphine-based nanoparticles of the formula CORE-$(PR_3)_n$, where the R groups are independently selected from the group consisting of phenyl, cyclohexyl and alkyl groups having 20 or fewer carbons, for example, octyl, and n is at least one; amine-based nanoparticles of the formula CORE-$(NHR)_n$, where R is selected from alkyl groups having 20 or fewer carbon atoms, for example, pentadecyl, and n is at least one; and thiol-based nanoparticles of the formula CORE-$(SR)_n$, where the R group is selected from the group consisting of phenyl, biphenyl, alkyl groups having 20 or fewer carbon atoms, for example, propyl, hexyl, nonyl, undecyl, hexadecyl and octadecyl, and n is at least one; nanoparticles of the formula CORE-$[S-(CH_2)_xCOOH]_n$, where x is between about 2 and about 20 and n is at least one, for example, where x is equal to 2, 5, or 10; nanoparticles of the formula CORE-$[S-(CH_2)_xOH]_n$ where x is between about 2 and about 20 and n is at least one, for example, where x is equal to 2; nanoparticles of the formula CORE-$[S-(CH_2)_xNR_2]_n$, where R is independently selected from the group consisting of hydrogen and C1-C4 alkyl, x is between about 2 and about 20 and n is at least one, for example, where x=2 and R is methyl; nanoparticles of the formula CORE-[S—(CH$_2$)$_x$NR$_3^+$]$_n$, where R is independently selected from the group consisting of C1-C4 alkyl, x is between about 2 and about 20, and n is at least one, for example, where x=2, and R is methyl; nanoparticles of the formula CORE-[S—(CH$_2$)$_x$SO$_3^-$]$_n$, where x is between about 2 and about 20, and n is at least one, for example, where x=2; nanoparticles of the formula CORE-[S—(CH$_2$)$_x$CONH(CH$_2$)$_y$CH$_3$], where x+y is between 1 and about 20 and n is at least one, for example, where x=2 and y=14; nanoparticles with amino-acid containing ligands, including glycine-based ligands, such as CORE-[-S—(CH$_2$)$_2$COGlyGlyOH]$_n$; and nanoparticles having intercalating ligands, such as shown below.

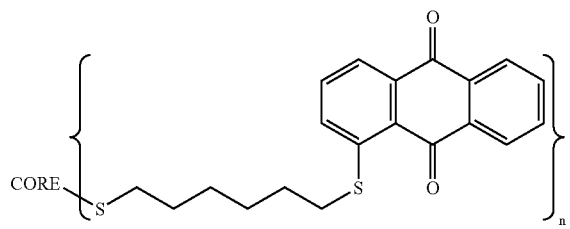

D. General Method for Producing Ligand-Stabilized Metal Nanoparticles

The general approach to making ligand-stabilized, metal nanoparticles first comprises forming substantially or completely monodisperse metal nanoparticles having displaceable ligands. This can be accomplished by directly forming such metal nanoparticles having the appropriate ligands attached thereto, but is more likely accomplished by first forming such ligand-stabilized, metal nanoparticles, which act as precursors for subsequent ligand-exchange reactions with ligands that are more useful for coupling nanoparticles to scaffolds.

One example, without limitation, of a substantially monodisperse gold nanoparticle that has been produced, and which is useful for subsequent ligand-exchange reactions with the ligands listed above, is the 1.4 nm phosphine-stabilized gold particle described by Schmid. Hexachlorodecakis(triphenylphosphine)-pentapentacontagold, Au$_{55}$[P(PPh$_3$)$_3$]$_{12}$Cl$_6$, *Inorg. Syn.* 1990, 27, 214-218, which is incorporated herein by reference. Schmid's synthesis involves the reduction of AuCl[PPh$_3$]. Example 1 below also discusses the synthesis of 1.4 nm phosphine-stabilized gold particles. One advantage of this synthesis is the relatively small size distribution of nanoparticles produced by the method, e.g., 1.4±0.4 nm.

Once ligand-stabilized, substantially monodisperse metal nanoparticles are obtained, such nanoparticles can be used for subsequent ligand-exchange reactions, as long as the ligand-exchange reaction is readily facile and produces monodisperse metal nanoparticles. Previously, it was not appreciated that the ligand exchange chemistry on 1.4 nm phosphine-stabilized gold nanoparticles could yield nearly monodisperse derivatives stabilized by ligands other than phosphines. In fact, some literature reports indicated that it was difficult, if not impossible, to form linked metal nanoparticles by ligand-exchange reactions. See, for example, Andres et al's Self-Assembly of a Two-Dimensional Superlattice of Molecularly Linked Metal Nanoparticles, *Science,* 1996, 273, 1690-1693.

To perform ligand-exchange reactions, a reaction mixture is formed comprising the metal nanoparticle having exchangeable ligands attached thereto and the ligands to be attached to the metal nanoparticle, such as thiols. A precipitate generally forms upon solvent removal, and this precipitate is then isolated by conventional techniques. See Example 3 for further details concerning the synthesis of ligand-stabilized 1.4-1.5 nm gold nanoparticles.

An example of a monodisperse gold nanoparticle is Au$_{11}$. Phosphine-stabilized undecagold particles are disclosed by Bartlett et al's Synthesis of Water-Soluble Undecagold Cluster Compounds of Potential Importance in Electron Microscopic and Other Studies of Biological Systems, *J. Am. Chem. Soc.* 1978, 100, 5085-5089, which is incorporated herein by reference. Au$_{11}$(PPh$_3$)$_8$Cl$_3$ may be prepared as described in Example 2. However, application of the present method for ligand exchange chemistry to smaller particles, e.g. phosphine-stabilized undecagold complexes was not a straightforward extension of the chemistry developed for the larger nanoparticles. The ligand exchange conditions used for the 1.4 nm gold particles fail when applied to undecagold particles. However, conditions were discovered under which Au$_{11}$(PPh$_3$)$_8$Cl$_3$, undergoes controlled ligand exchange with a variety of thiols to produce both organic- and water-soluble nanoparticles. Examples 4-6 demonstrate ligand exchange reactions of Au$_{11}$(PPh$_3$)$_8$C$_3$ with structurally diverse thiols. Au$_{11}$(PPh$_3$)$_8$Cl$_3$ is a particularly useful precursor for forming thiol-stabilized, undecagold particles because it is a molecular species with a defined chemical composition and is thus monodisperse.

III. Molecular Scaffolds

A. Introduction

Metal nanoparticles produced as stated above are coupled to molecular scaffolds. "Coupling" as used herein refers to some interaction between the scaffold and the ligand-stabilized metal nanoparticles such that the metal nanoparticles become associated with the scaffold. Associated may mean covalently bound, but also can include other molecular associations, such as electrostatic interactions (including dipole-dipole interactions, charge-dipole interactions, and charge-charge interactions), and hydrophobic interactions. "Coupling" includes attaching nanoparticles to scaffolds by (1) ligand exchange reactions where functional groups of the scaffold molecules, such as sulfur or other chalcogen-containing functional groups or amines, exchange with the ligands of the metal-ligand nanoparticle, (2) acid-base type reactions between the ligands and molecules of the scaffold, (3) intercalation of a ligand into, for example, a nucleic acid (e.g., DNA) helix, (4) electrostatic interactions between charged nanoparticles and oppositely charged scaffolds, and (5) covalent interactions between the nanoparticle's ligand shell and the scaffold.

B. Scaffolds Comprising Biomolecules

To form useful electronic devices, the scaffolds are advantageously disposed on a substrate in predetermined patterns to which electric contacts can be made. Therefore, scaffolds with regular, repeating features such as biomolecules with defined secondary structures are particularly useful. Scaffolds may comprise biomolecules, such as polynucleotides, polypeptides and mixtures thereof, and hence may be referred to as biomolecular scaffolds. Such scaffolds provide a number of advantages, including well-defined sequence information, high aspect ratio, predictable rigidity, and functional groups with orthogonal reactivity. There is some precedent for coupling metal particles to polynucleotides. See, for example, C. A. Mirkin et al. A DNA-Based Method for Rationally Assembling Nanoparticles into Macroscopic Materials, *Nature*, 1996, 382 607-609; and A. P. Alivisatos et al. Organization of "Nanocrystal Molecules" using DNA, *Nature*, 1996, 382, 609-611. Each of these references is incorporated herein by reference.

While the ligand shell defines the minimum separation of nanoparticles, the spacing of ligand binding sites on the scaffold defines the maximum separation. Thus, the scaffold chosen can influence the nanoparticle spacing, and different biomolecules, such as polynucleotides having different sequences may yield different distances between nanoparticles. Furthermore, polynucleotide-based scaffolds may provide a different spacing between metal nanoparticles than do polypeptides. Additional structures, including polysaccharides, such as dextran, may be useful for forming scaffolds. Lipid-based scaffolds may be useful for forming mono- or bi-layers for decorating with metal nanoparticles. Thus, by using various scaffold types, spacing between metal nanoparticles can be varied.

"Polypeptides" includes polypeptides that form α-helical secondary structures. Certain peptides, although attractive candidates from the standpoint of being stabilizing ligands for the metal nanoparticles, do not form α-helices, and hence may be functional, but not preferred, compounds. Many polypeptides form other well-defined secondary and/or tertiary structures, and hence are good candidates for forming scaffolds. For example, extended structures, such as β-sheets, may be particularly useful. The well-characterized collagen triple helix provides a particularly stable, extended structure and offers numerous points for derivatization.

It also should be appreciated that the polypeptide can be a "homopolypeptide," defined herein to refer to polypeptides having only one type of amino acid. One example of a homopolypeptide is polylysine. The free base form of polylysine readily forms an α-helix. Moreover, lysine provides a terminal amino group that is oriented favorably in the α-helix for ligand exchange reactions with the ligand-stabilized, metal nanoparticles. Homopolypeptides have been used for several reasons. First, certain homopolypeptides are commercially available, such as poly-L-lysine, poly-D-lysine, and poly-DL-lysine (available from Sigma, St. Louis, Mo.). Second, homopolypeptides provide predictable α-helix formation with the side chains oriented outwardly from the α helix at known, characterized distances. This allows the polypeptide to be designed for a particular purpose.

The peptide also may be a "heteropolypeptide" (having two or more amino acids), or block copolymer-type polypeptides (formed from plural different amino acids with identical amino acids being organized in blocks in the amino acid sequence), as long as such peptides contain groups that facilitate coupling with metal nanoparticles.

Most amino acids can be used to form suitable homo- or heteropolypeptides. Examples of particularly suitable amino acids include, but are not limited to, naturally occurring amino acids, such as lysine, arginine, cysteine, selenocysteine, tyrosine, and methionine; and other amino acids such as homolysine and homocysteine.

IV. Placing Scaffolds on Substrates

A. General Discussion

The scaffold simply may be placed on the surface of the substrate, in contrast to more tightly adhering the polypeptide to the substrate, such as through electrostatic or covalent bonds. As used herein, the term "substrate" refers to any material, or combination of materials, that might be used to form suitable devices, particularly electronic devices, such as without limitation, conductors, transistors, and inductors. For example, the substrate material may be selected from the group consisting of silicon, silicon nitride, glass, plastics, insulating oxides, semiconductor materials, quartz, mica, metals, and combinations thereof.

Simply placing the scaffold on a substrate surface, without considering whether to electrostatically or covalently bind the scaffold to the substrate, simplifies the process for making working devices. Placing the scaffold on the surface of the substrate can be accomplished by (1) forming solutions containing the molecular scaffold, (2) placing the solution containing the scaffold onto a substrate, such as by spin coating the solution onto a substrate, and (3) allowing the solvent to evaporate, thereby depositing the solid molecular scaffold onto the substrate surface. In this embodiment, the scaffold may adhere to the substrate by physisorption or chemisorption.

If simple deposition of the scaffold onto the substrate does not produce a sufficiently robust device, then the scaffold might be more tightly coupled to the substrate. One method for accomplishing this is to use compounds that act as adhesives or tethers between the substrate and the molecular scaffold. Which compounds to use as adhesives or tethers depends on the nature of the substrate and the metal nanoparticle. For example, amino-silane reagents may be used to attach molecular scaffolds to the substrate. The silane functional group allows the tether to be coupled to a silicon, glass or gold substrate. This provides a tether having a terminal amino group that can be used to react with the scaffold to tether the scaffold to the substrate. The terminal amino group also can be used as an initiation site for in situ polymerization of polypeptides using activated amino acids. Another class of tethers particularly useful for attaching polylysine to substrates is the ω-carboxyalkanethiols ($HO_2C-R-SH$). DNA may be coupled to mica by the addition of $Mg^{2+}$ ions or through functionalized molecular films on the substrate.

B. Organization of Scaffolds on Substrates

There are many methods for forming organized molecular arrays, particularly linear arrays, on the surface of substrates. One method comprises depositing dilute solutions of scaffold molecules onto substrates. A second method comprises aligning biomolecular scaffolds between electrodes using an electric field. Another comprises growing polypeptide chains between two or more electrodes beginning from an initiation site placed on an electrode. Yet another comprises flow-induced alignment of anchored scaffolds. Each of these approaches is discussed below and/or in the following examples.

1. Deposition from Dilute Solutions

Isolated molecular scaffolds can be prepared by depositing highly dilute solutions (i.e. dilute enough such that the scaffold molecules do not aggregate) onto substrate surfaces, and allowing the solvent to evaporate. Alternatively, scaffolds can be isolated by diluting the molecular scaffold film with an inert, α-helical polypeptide, such as poly-γ-benzyl-L-glutamate. See, *Poly(γ-Benzyl-L-Glutamate) and Other*

*Glutamic Acid Containing Polymers*, H. Block (Gordon & Breach, NY) 1983, which is incorporated herein by reference.

2. Aligning Scaffolds in an Electrical Field

A practical method for aligning scaffolds on a substrate employs an electrical field produced between two electrodes. FIG. 1 illustrates saw tooth electrodes 10 comprising electrodes 12-20 that are placed on a substrate by known methods, such as electron-beam lithography, UV-photolithography, charged particle beam lithography, thermal evaporation, or lift-off techniques. A solution comprising the scaffold molecules is first formed and then applied to the surface of the substrate having the electrode pattern placed thereon, such as a substrate having the electrode pattern of FIG. 1. α-Helical polypeptides, for example, self-align (pole) in the presence of an applied magnetic field or electrical field (typically 20 $Vcm^{-1}$). See, S. Itou, Reorientation of Poly-γ-benzyl-L-glutamate Liquid Crystals in an Electric Field, *Jpn. J. Appl. Phys.* 1985, 24, 1234, which is incorporated herein by reference. Presumably this is due to their large diamagnetic anisotropy. See also, C. T. O'Konski et al. Electric Properties of Macromolecules IV. Determination of Electric and Optical Parameters From Saturation of Electric Birefringence in Solutions, *J. Phys. Chem.* 1959, 63, 1558.

An electric field is generated between the electrodes, such as the points of the saw tooth illustrated in FIG. 1. This local field between the two points causes the scaffold to align between the points. The solvent is evaporated to provide scaffolds oriented between the electrodes.

Based on the above, it will be apparent that the dipole moment of the scaffold influences whether the scaffold may be oriented between the two electrodes, and the efficiency of the orientation. This is one reason why α-helical polypeptides are particularly useful polypeptides for forming scaffolds. The hydrogen bonds formed in the α-helix all orient in the same direction, thereby aligning the amide and carboxyl groups of the peptide backbone and imparting an overall dipole to the secondary a helical structure. It currently is believed that the dipole is primarily the result of the α helix, and not the side chains.

3. Growing Polypeptides Between Electrodes

In some instances, it may be desirable to use scaffolds to bridge directly between two electrical contacts of interest. This can be accomplished by first placing initiating sites on the electrodes, and then "growing" polypeptides between the initiation sites on the electrodes to form a bridge. One example of how this would be accomplished is to attach a tether to an electrode, the tether having a pendant functional group that is capable of forming peptide bonds when reacted with an activated amino acid. The most likely pendant functional group for this purpose is a 1° amine.

To provide a specific example to illustrate the procedure, a tether comprising an alkyl chain having both a terminal amino group and a terminal sulfhydryl group (i.e., an amino-thiol, HS—R—$NH_2$) is reacted with a gold electrode. This covalently attaches the sulfhydryl group of the tether to the metal (i.e., Au—S—R—$NH_2$). The terminal amino group is then used to initiate polymerization of a polypeptide using activated amino acids, perhaps in the presence of an applied field, between the two electrodes. The polymerization is accomplished by supplying activated amino acids for reaction with the primary amine in a chain-growing reaction that serially couples amino acids to the end of the growing chain and regenerates the primary amine for subsequent reaction with another activated amino acid.

Activated amino acids are commercially available and are described in the literature. Activated amino acids useful for growing polypeptides include N-carboxyanhydride (NCA) amino acids. NCA amino acids react with surface-bound initiator sites (e.g., the primary amino groups) to begin a ring-opening polymerization of the NCA-amino acid. See, J. K. Whitesell et al. Directionally Aligned Helical Peptides on Surfaces, *Science* 1993, 261, 73. Whitesell's publication is incorporated herein by reference.

When NCA polymerization is performed under the influence of an electric field applied between two electrodes it is possible to "grow" the polypeptide scaffolds from one electrode to another. One specific example of an NCA amino acid that can be used for this purpose is that derived from N-ε-benzyloxycarbonyl-L-lysine. The amino acid side chains of this compound can be deprotected using trimethylsilyl iodide. Deprotection yields the poly-L-lysine scaffold.

Working embodiments have used polylysine as the polypeptide useful for forming the molecular scaffold. Polylysine was chosen because it includes a hydrocarbon chain that extends the amino functional group, which can undergo ligand-displacement reactions or covalent bond-forming reactions with the ligand-stabilized, metal nanoparticle, out and away from the polypeptide backbone. Thus, two criteria that may be used to select polypeptides for use as molecular scaffolds are (1) the ability of the polypeptide to form a well-defined structure, and (2) the presence of side chains that provide functional groups that are metal-nanoparticle stabilizing and capable of undergoing ligand-exchange reactions with the ligand-stabilized metal nanoparticles.

4. Forming Polynucleotide Scaffolds

DNA also is a useful material for forming scaffolds, and has many advantages. For example, it is much easier to form long polynucleotide chains than polypeptide chains. Furthermore, DNA provides a more rigid material, and this is a beneficial attribute of scaffold materials. See, for example, (1) E. Braun et al. DNA Templated Assembly and Electrode Attachment of a Conducting Silver Wire *Nature* 1998, 391, 775-778; (2) N. Seeman, DNA Components for Molecular Architecture, *Accounts of Chemical Research* 1997, 30, 357; Qi J., et al. Ligation of Triangles Built from Bulged 3-Arm DNA Branched Junctions, *J. Am. Chem. Soc.* 1996, 118, 6121; and C. Niemeyer et al. DNA as a Material for Nanotechnology, *Angew. Chem., Int. Ed. Eng.* 1997, 36, 585. Each of these references is incorporated herein by reference. The Braun reference provides a method for positioning a DNA molecule between electrodes spaced by a particular distance, such as about 10 μm. Double-stranded DNA, with single-stranded sticky ends, and a pair of electrodes that have single-stranded DNA attached thereto that is complementary to the sequence of the sticky ends of the DNA, are prepared. Annealing the sticky ends to the single-stranded primers allows coupling of double-stranded DNA between two electrodes spaced by a known distance. Sticky ends also could be attached directly to the two termini of the DNA double strands.

The Seeman reference reviews the suitability of DNA as a macromolecular construction material. The reference highlights the physical characteristics of DNA and reviews the construction of DNA geometrical objects, such as polyhedra. The reference notes at page 363 that DNA can embody three required properties for nanoconstruction: "(1) the predictable specificity of intermolecular interactions between components; (2) the structural predictability of intermolecular products; and (3) the structural rigidity of the components."

There are other methods for positioning DNA scaffolds on a substrate. For example, and without limitation, DNA may be manipulated by: electric fields between two electrodes; attaching one end of a DNA strand to an electrode, and then using solution flow toward another electrode to align the DNA between the two electrodes; and/or using optical tweezers or laser traps to place the DNA in a particular alignment.

V. Decorating Scaffolds With Metal Nanoparticles

Figure 2:
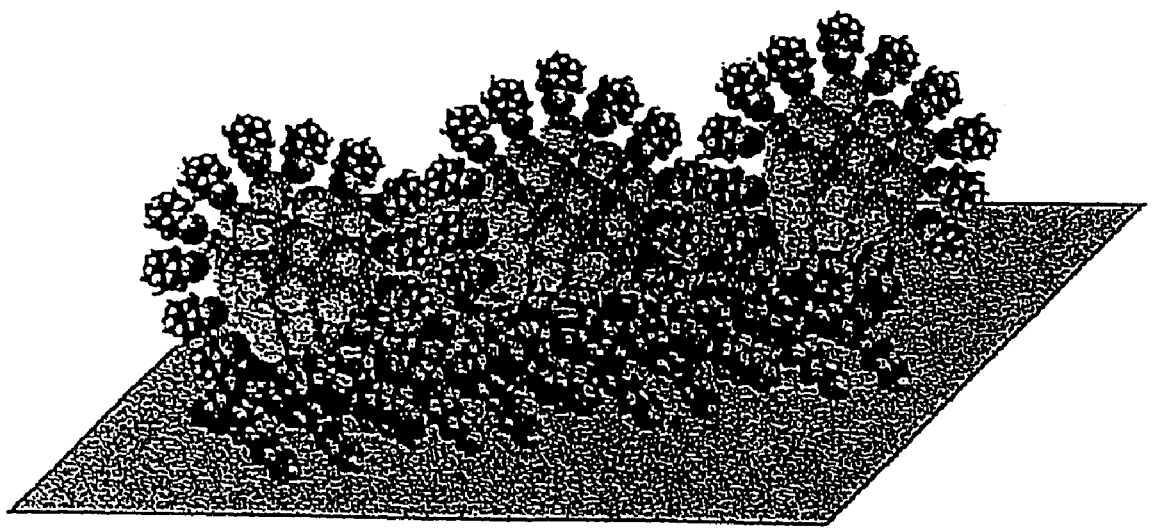
FIG. 2 is a schematic representation of a poly-L-lysine scaffold having thiophenolate-stabilized nanoparticles coupled thereto.

To provide working electronic devices, nanoparticles are coupled to the scaffolds. FIG. 2 provides a schematic representation of a poly-L-lysine that is "decorated" with metal nanoparticles, i.e., the nanoparticles are coupled to the scaffold. A first consideration is whether to decorate the scaffold with nanoparticles prior to or subsequent to placing the scaffold onto a substrate.

The method comprising first placing a scaffold onto a substrate, and subsequently decorating the scaffold with nanoparticles, may be accomplished by first forming a solution comprising the ligand-stabilized, substantially monodisperse or monodisperse nanoparticles using a solvent that does not dissolve the scaffold. Solvents for this purpose include, without limitation, dichloromethane and hexanes, for use with nanoparticles soluble in these organic solvents. The ligand-stabilized nanoparticles are then introduced onto the scaffold and allowed to undergo reactions with the scaffold molecules, such as ligand-exchange or acid-base type reactions, thereby coupling the ligand-stabilized nanoparticles to the scaffold. See Example 4 for further details concerning decorating scaffolds with nanoparticles.

The present approach to producing decorated scaffolds also allows for good lateral definition, which is an important feature. "Lateral definition" refers to the width of an array. Previously, the state of the art was capable of producing lines having a width of about 300 Å. In the present disclosure, lateral resolution is much improved, and is on the order of about 30 Å. In addition, branched polypeptides and polynucleotides offer the possibility of introducing control electrodes and interconnects at the molecular level.

VI. Ultrafast, Ultrahigh Density Switching Devices

This section discusses the steps required to use the decorated molecular scaffolds described above to produce electronic devices, such as ultrafast, ultrahigh density switching devices. First, an insulating substrate is selected and cleaned. One example of a substrate is a silicon nitride chip or wafer. On top of this substrate would be placed electrical contacts. This could be accomplished using known technologies, such as lithography and deposition of a metal, such as gold.

Once a substrate is obtained having the electrical contacts placed thereon, a scaffold is then placed on the surface using the techniques described above. The scaffold may be decorated with nanoparticles before attachment to the substrate, or, alternatively, the scaffold is treated with substantially or completely monodisperse, ligand-stabilized nanoparticles to attach such nanoparticles to the scaffold after the scaffold is bound to the substrate. The organization of the scaffold likely determines the particular device being made.

For a switching device, analogous to a transistor, saw tooth electrical contacts, such as those shown in FIG. 1, are deposited onto a substrate and a scaffold then oriented therebetween. This provides two arms of a transistor. A capacitance contact required to provide the third arm of a transistor is imbedded in the substrate underneath the molecular scaffold. Direct electrical contact with this "gate" imbedded in the substrate is not actually required.

Figure 3:
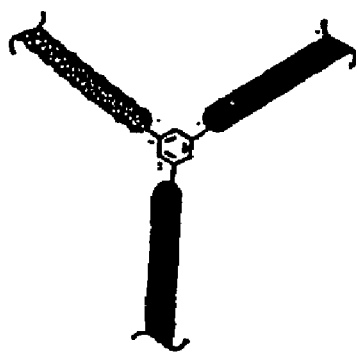
FIG. 3 is a schematic representation of one method for incorporating gate electrodes at the molecular level.

Alternatively, a third contact arm could be incorporated into the template. FIG. 3 is a schematic representation of a scaffold useful for this purpose. For example, a polypeptide of a particular length, e.g., a 25-mer or 50-mer, first could be coupled to an electrode. A branching portion of the scaffold then could be attached, thereby forming an electrical arm, or plural such arms, for further providing single or multiple gate electrodes to the template. The scaffold is then coupled between two electrodes subsequent to the formation of this contact arm or arms. Similar structures can be constructed from other polymers and biopolymers.

The method can be used to form a variety of standard circuit components to implement Boolean logic functions. These circuit components include, but are not limited to, AND, NAND, NOR, OR and Exclusive OR gates. Additionally, multiplexers and muliplexer-based circuits can be created and used to implement Boolean logic functions.

VII. Production and Use of Phosphine-Stabilized Gold Nanoparticles

The present method provides the first new route to producing phosphine-stabilized gold nanoparticles since their first description nearly twenty years ago. The described route is substantially simpler and safer than the traditional route, which involves the use of diborane gas (see Example 1, below). TEM, XPS and ligand (thiol) exchange reactions respectively reveal that the size, composition and reactivity of nanoparticles synthesized using this new method are comparable to those produced by the traditional route. Additionally, this simple route can produce large quantities of gold nanoparticles capped by tricyclohexylphosphine or trioctylphosphine, producing a novel class of trialkylphosphine stabilized nanoparticles.

First described by Schmid in 1981, phosphine-stabilized gold nanoparticles, commonly referred to as "Au 55," paved the way for investigating the properties of metal nanoparticles. These nanoparticles have a diameter of about 1.4 nm, thus nanoparticles prepared by the Schmid protocol also are referred to herein as 1.4 nm nanoparticles. The small size and low dispersity of triphenylphosphine-passivated gold nanoparticles continues to make them important tools in nanoelectronics, biological tagging, and structural studies. Recently the ability to exchange thiol ligands onto triphenylphosphine-passivated nanoparticles was demonstrated, which enabled the coupling of small size and low dispersity with the stability of thiol-passivated gold. This facilitates applications that require both high stability and small core size, such as room temperature, Coulomb-blockade-based nanoelectronics. One embodiment of the present method provides a convenient gram-scale synthesis of 1.4 nm triphenylphosphine stabilized nanoparticles that are comparable in both size and reactivity to the traditional 1.4 nm nanoparticles prepared by the Schmid protocol (Example 11). This route utilizes commercially available reagents and replaces a hazardous reducing agent. The generality of this synthetic method has been explored through the synthesis of previously unknown aliphatic, phosphine-stabilized gold nanoparticles, particularly trialkylphosphine stabilized nanoparticles.

A working embodiment of the synthesis is illustrated by Scheme 1.

Scheme 1

$$HAuCl_4 + 3PPh_3 + NaBH_4 \xrightarrow{a} Au_{101}(PPh_3)_{12.5}Cl_3{}^b$$

With reference to Scheme 1, "a" refers to reaction conditions, including an organic-aqueous solvent system (e.g., toluene: water biphasic solvent system), a phase transfer catalyst, such as tetraoctylammonium bromide (see below), and a reaction time suitable to provide desired products (e.g., about 5 hours). Formula "b" is the empirical formula of the resulting product, which is based upon size and atomic composition measurements.

Phosphine-stabilized gold nanoparticles produced by the method described herein can be used in any applications in which traditionally synthesized gold nanoparticles are used. Such applications include, of course, the construction of scaffold-organized nanoparticles and electronic devices including such nanoparticles described in the present application. In addition, the aliphatic, phosphine-stabilized gold nanoparticles can be used as biological tags (e.g., in electron microscopy or for the detection of positive associations on biological microarrays such as cDNA microarrays). Gold particles can be used, for instance, to label peptide molecules (Segond von Banchet and Heppelmann, Histochem. Cytochem. 1995, 43, 821-827), proteins (for instance, antibodies or fragments thereof as described in Hainfeld and Furuya, J. Histochem. Cytochem. 1992, 40, 177-184); or nucleic acid molecules (such as hybridization probes), or liposomes (Hainfeld, Proc. An. Mtg, Micros. Soc. Am. San Francisco Press, San Francisco, Calif., pp. 898-899, 1996). Ligand exchange reactions with thiols can be used to convert these phosphine-stabilized nanoparticles to thiol-stabilized nanoparticles as described in Section II D.

In certain embodiments, gold nanoparticles can be used in combination with other labels, such as fluorescent or luminescent labels, which provide different means of detection, or other specific binding molecules, such as a member of the biotin/(strept)avidin specific binding family (e.g., as described in Hacker et al. Cell Vision 1997, 4, 54-65.)

VII. Examples

The following examples are provided to illustrate certain particular embodiments of the disclosure. It should be understood that additional embodiments not limited to these particular features described are consistent with the following examples.

Example 1

This example describes the synthesis of 1.4 nm phosphine-stabilized gold particles. AuCl(PPh$_3$) was reduced in benzene using diborane (B$_2$H$_6$), which was produced in situ by the reaction of sodium borohydride (NaBH$_4$) and borontrifluoride etherate [BF$_3$.O(C$_2$H$_5$)]. Au$_{55}$(PPh$_3$)$_{12}$C$_{16}$ was purified by dissolution in methylene chloride followed by filtration through Celite. Pentane was then added to the solution to precipitate a black solid. The mixture was filtered and the solid was dried under reduced pressure to provide 1.4 nm phosphine-stabilized gold particles in approximately 30% yield.

Example 2

This example describes the synthesis of Au$_{11}$(PPh$_3$)$_8$Cl$_3$, a triphenylphosphine-stabilized Au$_{11}$ nanoparticle. NaBH$_4$ (76 mg, 2.02 mmol) was slowly added to a mixture of AuCl(PPh$_3$) (1.00 g, 2.02 mmol) in absolute EtOH (55 mL) over 15 minutes. After stirring at room temperature for 2 hours, the mixture was poured into hexanes (1 L) and allowed to precipitate over approximately 20 hours. The resulting brown solid was collected and washed with hexanes (4×15 mL), CH$_2$Cl$_2$/hexanes (1:1 v/v 4×15 mL) and CH$_2$Cl$_2$/hexanes (3:1, 10 mL). The remaining solid was dissolved in CH$_2$Cl$_2$ (15 mL) and filtered a second time to remove a colorless, insoluble powder. Crystallization from CH$_2$Cl$_2$/hexanes gave Au$_{11}$(PPh$_3$)$_8$Cl$_3$ (140 mg, 18% yield) as deep red plates. The structure was confirmed by melting point, elemental analysis, X-ray photoelectron spectroscopy and $^1$H NMR.

Example 3

This example describes the synthesis of 1.4 nm thiol-stabilized gold particles. Dichloromethane (~10 mL), 1.4 nm phosphine-stabilized gold particles (20.9 mg) and octadecylthiol (23.0 mg) were combined in a 25 mL round bottom. A black solution was produced, and this solution was stirred under nitrogen at room temperature for 36 hours. The solvent was removed under reduced pressure and acetone was added to suspend a black powder. The solid was isolated by vacuum filtration and washed with acetone (10×5 mL). After the final wash, the solid was redissolved in hot benzene. The benzene was removed under reduced pressure with gentle heating to yield a dark brown solid.

The solid material was then subjected to UV-VIS (CH$_2$Cl$_2$, 230-800 nm), $^1$H NMR, $^{13}$C NMR, X-ray photoelectron spectroscopy (XPS) and atomic force spectroscopy.

In the X-ray photoelectron spectroscopy (XPS) measurement, molecules are irradiated with high-energy photons of fixed energy. When the energy of the photons is greater than the ionization potential of an electron, the compound may eject the electron, and the kinetic energy of the electron is equal to the difference between the energy of the photons and the ionization potential. The photoelectron spectrum has sharp peaks at energies usually associated with ionization of electrons from particular orbitals. X-ray radiation generally is used to eject core electrons from materials being analyzed. Clifford E. Dykstra, Quantum Chemistry & Molecular Spectroscopy, pp. 296-295 (Prentice Hall, 1992).

Quantification of XPS spectra gave a gold-to-sulfur ratio of about 2.3:1.0 and shows a complete absence of phosphorus and chlorine. As is the case of the phosphine-stabilized nanoparticles, a broad doublet is observed for the Au 4f level. The binding energy of the Au 4f 7/2 level is about 84.0-84.2 eV versus that of adventitious carbon, 284.8 eV. This indicates absence of Au(I) and is similar to binding energies obtained for nanoparticles such as Au$_{55}$(PPh$_3$)$_{12}$Cl$_6$. The binding energy of the S 2p 3/2 peak ranges from 162.4 to 162.6 eV for the series of nanoparticles. These values are shifted to lower energy than those found for free thiols (163.3-163.9 eV) and are close to the values reported for thiolates bound to bulk gold (162.0-162.4 eV). $^1$H and $^{13}$C NMR unambiguously rules out the possibility that unattached thiols may be present in the sample.

Thermal gravimetric analysis confirmed the Au:S ratio obtained from XPS. On heating to 600° C., ODT-stabilized nanoparticles display a 40% mass loss, corresponding to 26 ODT ligands on an assumed 55-atom gold nanoparticle. This ratio alludes to the retention of a small nanoparticle size. A sample of the larger hexadecanethiol-stabilized gold nanoparticle has been shown to give a 33.5% mass loss, corresponding to from about 95 to about 126 ligands per nanoparticle (diameter=2.4 nm).

Figure 4:
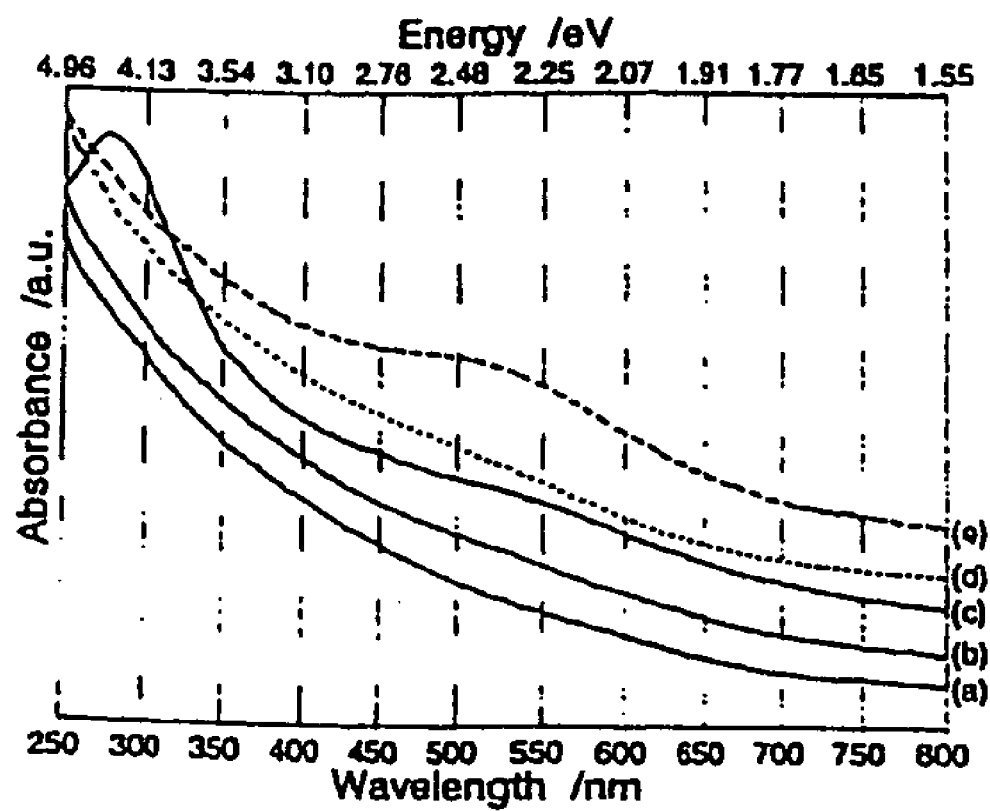
FIG. 4 shows UV-Vis spectra (in methylene chloride solution) of gold nanoparticles with the ligands (a) ODT, (b) Pth, and (c) MBP, and where (d) is starting material and (e) is a sample of larger ODT-stabilized nanoparticles.

Optical spectra of gold colloids and nanoparticles exhibit a size-dependent, surface plasmon resonance band at about 520 nm (See FIG. 4). In absorption spectra of ligand-exchanged nanoparticles produced as stated in this example, the interband transition typically observed for small nanoparticles, including $Au_{55}(PPh_3)_{12}Cl_6$, was observed. Little or no plasmon resonance was observed, consistent with a nanoparticle size of about 1.7 nm or less. For the ODT-passivated nanoparticle, no plasmon resonance was observed.

Figure 5:
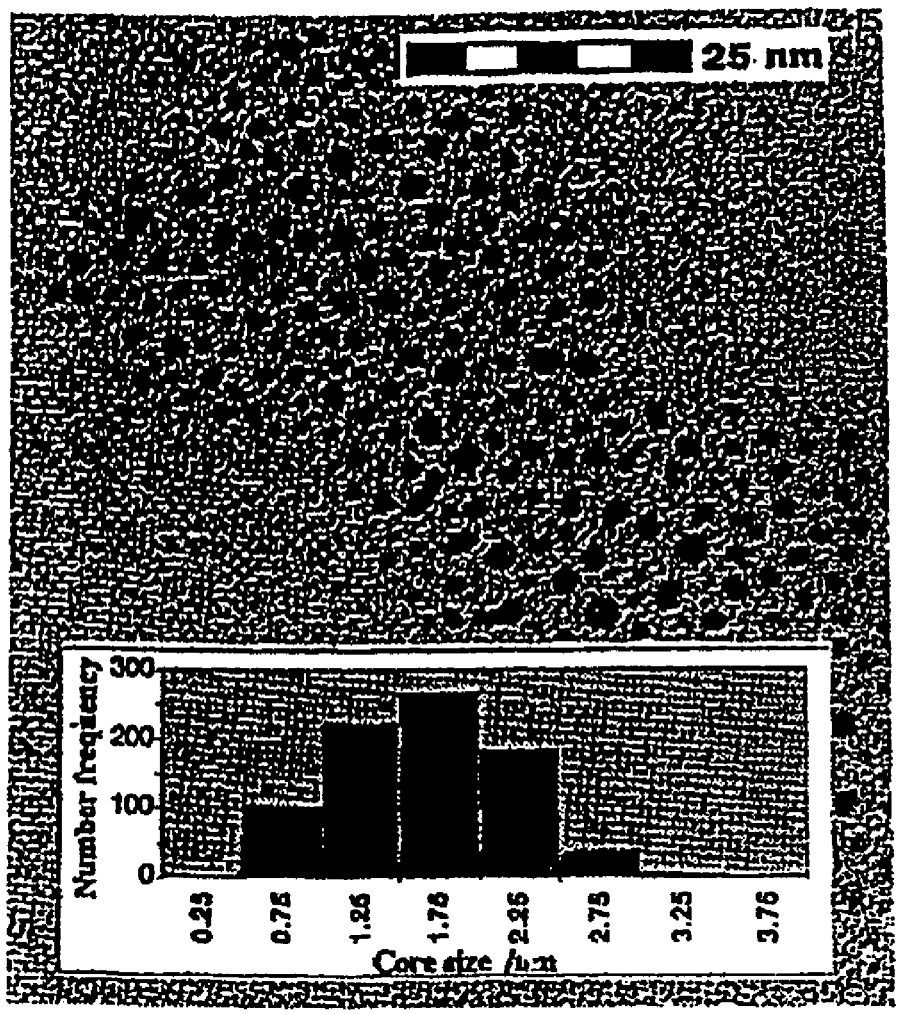
FIG. 5 is a TEM of ODT-stabilized nanoparticles (aerosol-deposited from methylene chloride solution onto a carbon-coated copper grid).

Quantitative size information can be obtained using transmission electron microscopy (TEM). The core size obtained from TEM images of the ODT-stabilized nanoparticle (FIG. 5) was found to be 1.7±0.5 nm and agrees with the size obtained from atomic force microscope images.

Atomic force microscopy (AFM) also was performed on the $Au_{55}(SC_{18}H_{37})_{26}$ produced according to this example. The analysis produced a topographical representation of the metal complex. AFM probes the surface of a sample with a sharp tip located at the free end of a cantilever. Forces between the tip and the sample surface cause the cantilever to bend or deflect. The measured cantilever deflections allow a computer to generate a map of surface topography. Rebecca Howland et al. *A Practical Guide to Scanning Probe Microscopy*, p. 5, (Park Scientific Instruments, 1993). The AFM data for particles produced according to this example showed heights of 1.5 nm for single nanoparticles and aggregates subjected to high force. This corresponds to the size of the gold core nanoparticles. This helped establish that the gold nanoparticles of this example were close to the correct size for forming useful devices. In a manner similar to that described above for Example 2, thiol stabilized structures also have been made using 1-propanethiol.

Example 4

This example describes the preparation of an organic-soluble, octadecane thiol-stabilized $Au_{11}$ particles from monodisperse $Au_{11}(PPh_3)_8Cl_3$ via ligand exchange. A mixture of $Au_{11}(PPh_3)_8Cl_3$, prepared according to the procedure of Example 2, (10 mg, 2.3 µmol) and octadecanethiol (13 mg, 45 µmol) dissolved in $CHCl_3$ (30 mL) was stirred for 24 hours at 55° C. Volatiles were removed and the crude solid product was dissolved in i-PrOH and filtered to remove insoluble Au(I) salts. The filtrate was purified via gel filtration over Sephadex LH-20 using i-PrOH as the eluent. The purified octadecanethiol-stabilized particles yielded satisfactory $^1H$ NMR and $^{13}C$ NMR. Well-defined optical absorptions in the visible spectrum are distinguishable from the spectra obtained for the larger 1.5 nm core particles by inspection.

Example 5

This example describes the preparation of a water-soluble, (N,N-dimethylamino) ethanethiol-stabilized $Au_{11}$ particle. A mixture of (N,N-dimethylamino) ethanethiol hydrochloride (12 mg, 85 µmol) in degassed $H_2O$ (30 mL) and $Au_{11}(PPh_3)_8Cl_3$ (20 mg, 4.6 µmol) in degassed $CHCl_3$ (30 mL) was stirred vigorously for 9 hours at 55° C. (until all colored material was transferred into the aqueous layer). The layers were separated and the aqueous layer washed with $CH_2Cl_2$ (3×15 mL). Volatiles were removed and the crude solid product was dissolved in EtOH (3 mL) and precipitated with hexanes. The precipitate was collected on a frit and washed with hexanes (30 mL) and $CHCl_3$ (30 mL). The washed material yielded analytical data ($^1H$ NMR, TEM, XPS) consistent with (N,N-dimethylamino) ethanethiol-stabilized $Au_{11}$ nanoparticles of an average core size of 0.9±0.2 nm.

Example 6

This example concerns the preparation of a water-soluble, sodium 2-mercaptoethanesulfonate-stabilized $Au_{11}$ particle. A mixture of $Au_{11}(PPh_3)_8Cl_3$ (29 mg, 6.7 µmol) in $CHCl_3$ (20 mL) and sodium-2-mercaptoethanesulfonate (24 mg, 146 µmol) in $H_2O$ was stirred vigorously for 1.5 hours at 55° C., until all colored material was transferred into the aqueous layer. The layers were separated and the aqueous layer was extracted with $CH_2Cl_2$ (3×20 mL). After removal of the water, the crude product was suspended in methanol, transferred to a frit and washed with methanol (3×20 mL). The resulting material (25 mg, 5.8 µmol) and additional sodium 2-mercaptoethanesulfonate (5 mg, 30 µmol) in $H_2O$/THF (1:1, 40 mL) was stirred vigorously for 6 h at 50° C. The mixture was washed with $CHCl_3$ (3×20 mL) to remove THF. After the water was removed in vacuo the crude material was suspended in methanol (30 mL), transferred to a frit and washed with methanol (3×20 mL) to remove excess ligand. $^1H$ NMR, XPS analysis, and TEM micrographs confirmed the desired structure.

Example 7

This example describes the synthesis of 4-mercaptobiphenyl-stabilized 1.4 nm gold nanoparticles. Dichloromethane (~10 mL), 1.4 nm triphenylphosphine-stabilized gold nanoparticles (prepared according to the procedure of Example 1) (25.2 mg) and 4-mercaptobiphenyl (9.60 mg) were combined in a 25 mL round bottom. The resulting black solution was stirred under nitrogen at room temperature for 36 hours. The solvent was removed under reduced pressure and replaced with acetone. This resulted in the formation of a black powder suspension. The solid was isolated by vacuum filtration and washed with acetone (6×5 mL). The solvent was then removed under reduced pressure to yield 16.8 mg of a dark brown solid.

The solid material was subjected to UV-Vis ($CH_2Cl_2$, 230-800 nm), $^1H$ NMR, $^{13}C$ NMR, X-ray photoelectron spectroscopy (XPS) and atomic force spectroscopy as in Example 2. This data confirmed the structure and purity of the metal complex, and further showed complete ligand exchange. For example, quantification of the XPS data for material prepared according to this example showed that Au 4f comprised about 71.02% and S 2p constituted about 28.98%, which suggests a formula of $Au_{55}$(S-biphenyl)$_{25}$.

AFM analysis showed isolated metal nanoparticles measuring about 2.5 nm across, which correlates to the expected size of the gold core with a slightly extended sphere.

Thiol-stabilized nanoparticles produced as described above display remarkable stability relative to 1.4 nm phosphine-stabilized gold nanoparticles, which decomposes in solution at room temperature to give bulk gold and AuCl [$PPh_3$]. No decomposition for the thiol-stabilized nanoparticles was observed, despite the fact that some samples were deliberately stored in solution for weeks. In other tests, the mercaptobiphenyl and octadecylthiol-stabilized nanoparticles (in the absence of free thiol) were heated to 75° C. for periods of more than 9 hours in dilute 1,2-dichloroethane solution with no resultant degradation. Under identical conditions, 1.4 nm phosphine-stabilized gold nanoparticles decompose to Au(O) and AuCl[$PPh_3$] within 2 hours.

Example 8

Figure 6:
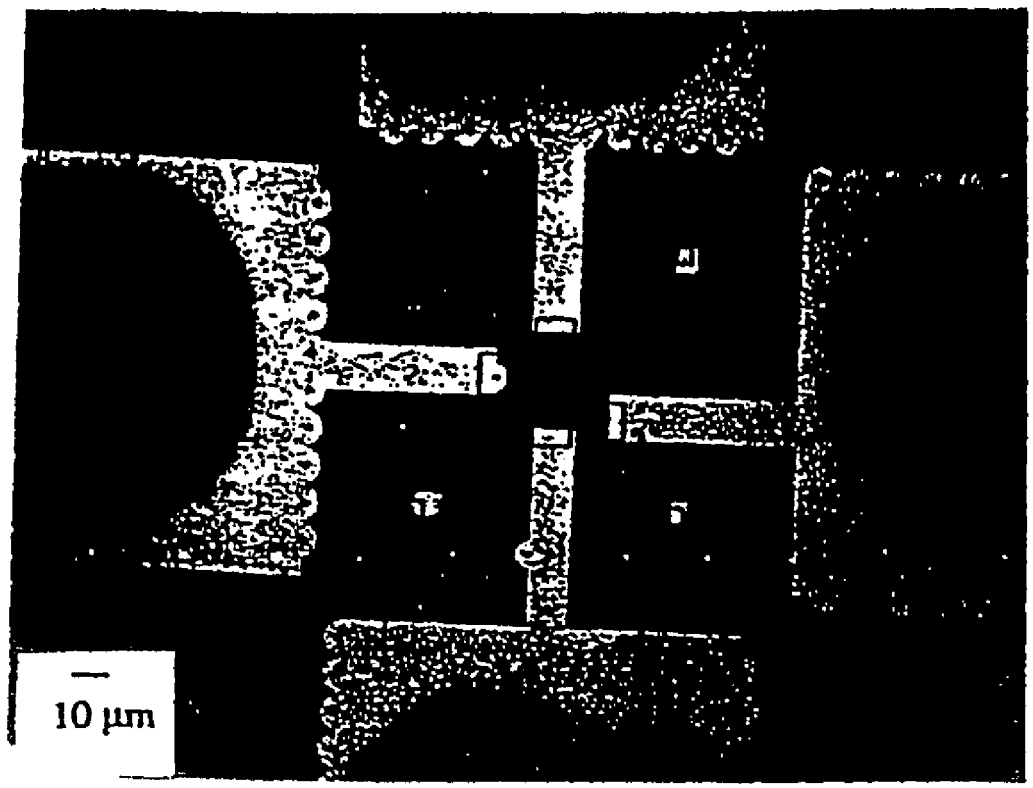
FIG. 6 is an electron micrograph of a patterned gold nanoparticle structure.

This example describes the electron transfer properties of organometallic structures formed by electron-beam irradiation of 1.4 nm phosphine-stabilized gold nanoparticles. This compound was produced as stated above in Example 1. A solution of the gold nanoparticle was made by dissolving 22 mg of the solid in 0.25 mL of $CH_2Cl_2$ and 0.25 mL of 1,2-dichloroethane. A supernatant solution was spin coated onto a $Si_3N_4$ coated Si wafer at 1,500 rpm for 25 seconds immediately after preparation. The film was patterned by exposure to a 40 kV electron beam at a line dosage of 100 nC/cm. The areas of the film exposed to the electron beam adhered to the surface and a $CH_2Cl_2$ rinse removed the excess film. This procedure produced well-defined structures. See FIG. 6. These structures appeared to be smooth and continuous under SEM inspection. Attempts were made to pattern the material using 254 nm UV lithography, but it was found to be insensitive to this wavelength. The defined structures had dimensions as small as 0.1 μm and AFM inspection measured the film thickness to be 50 nm.

The organometallic samples were spin-coated with PMMA that was electron-beam exposed and developed to define contact regions. Contacts were fabricated using thermal evaporation of 100 nm of gold and conventional liftoff procedures.

DC current-voltage (I-V) measurements of several samples were taken. A shielded chamber, submerged in an oil bath, contained the sample mounted on a clean teflon stage. Rigid triaxial connections were used to connect the sample to a constant DC voltage source and electrometer. The oil bath temperature was controlled from 195 to 350 K. Thermal equilibrium was achieved with a 10 Torr partial pressure of He in the chamber. Before electrical measurements the chamber was evacuated to a pressure ~$10^{-5}$ Torr. The data showed little temperature drift over a typical four hour measurement sweep. The intrinsic leakage current of the system was measured using a control sample having the same substrate and contact pad arrangement as the actual samples, but did not have the organometallic between the pads. At room temperature, the leakage current was almost linearly dependent on bias over the range −100 to 100V, and had a maximum value ≦100 fA. While the ultimate resolution of the current measurement was 10 fA, the leakage current set the minimum resolved conductance ~$10^{-15} \Omega^{-1}$. Constant amplitude RF signals with frequencies, f, from 0.1 to 5 MHz, were applied to the samples through a dipole antenna at 195 K. No attempt was made to optimize the coupling between the RF signal and the sample.

Figure 7:
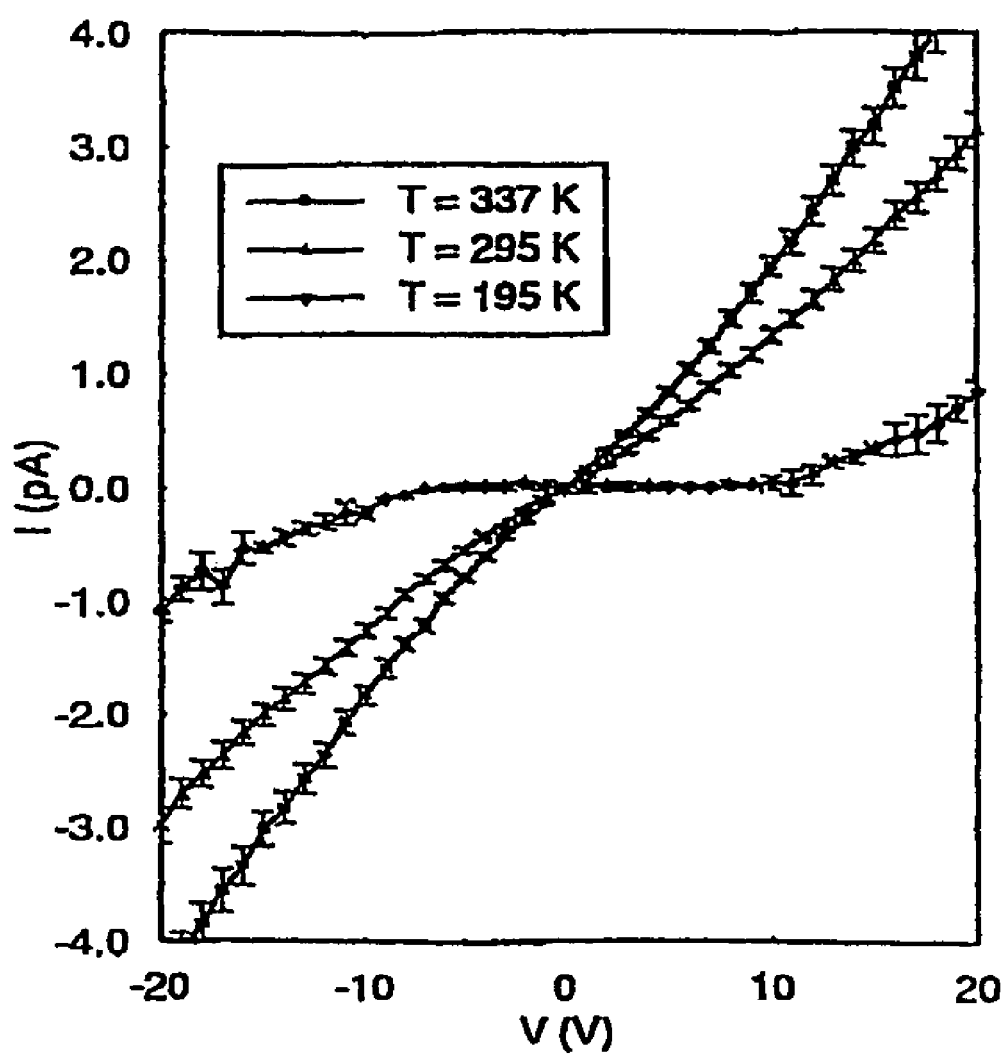
FIG. 7 is a graph illustrating current-voltage (I-V) characteristics of 1.4 nm phosphine-stabilized gold nanoparticles at temperatures of 195 K, 295 K and 337 K.

Without RF, the I-V characteristics for one sample at several temperatures are shown in FIG. 7. As the temperature was reduced, the low voltage portion of the curve flattened out and the current became indistinguishable from the leakage current. Above an applied voltage magnitude of 6.7±0.6 V, the current increased abruptly. The data illustrated in FIG. 7 establishes that substantially monodisperse gold nanoparticles can produce devices that operate on the basis of the Coulomb blockage effect. This can be determined from FIG. 7 because one of the curves has zero slope, indicating no current at the applied voltage, i.e., the nanoparticle is blockaded at the particular temperature tested.

Figure 8:
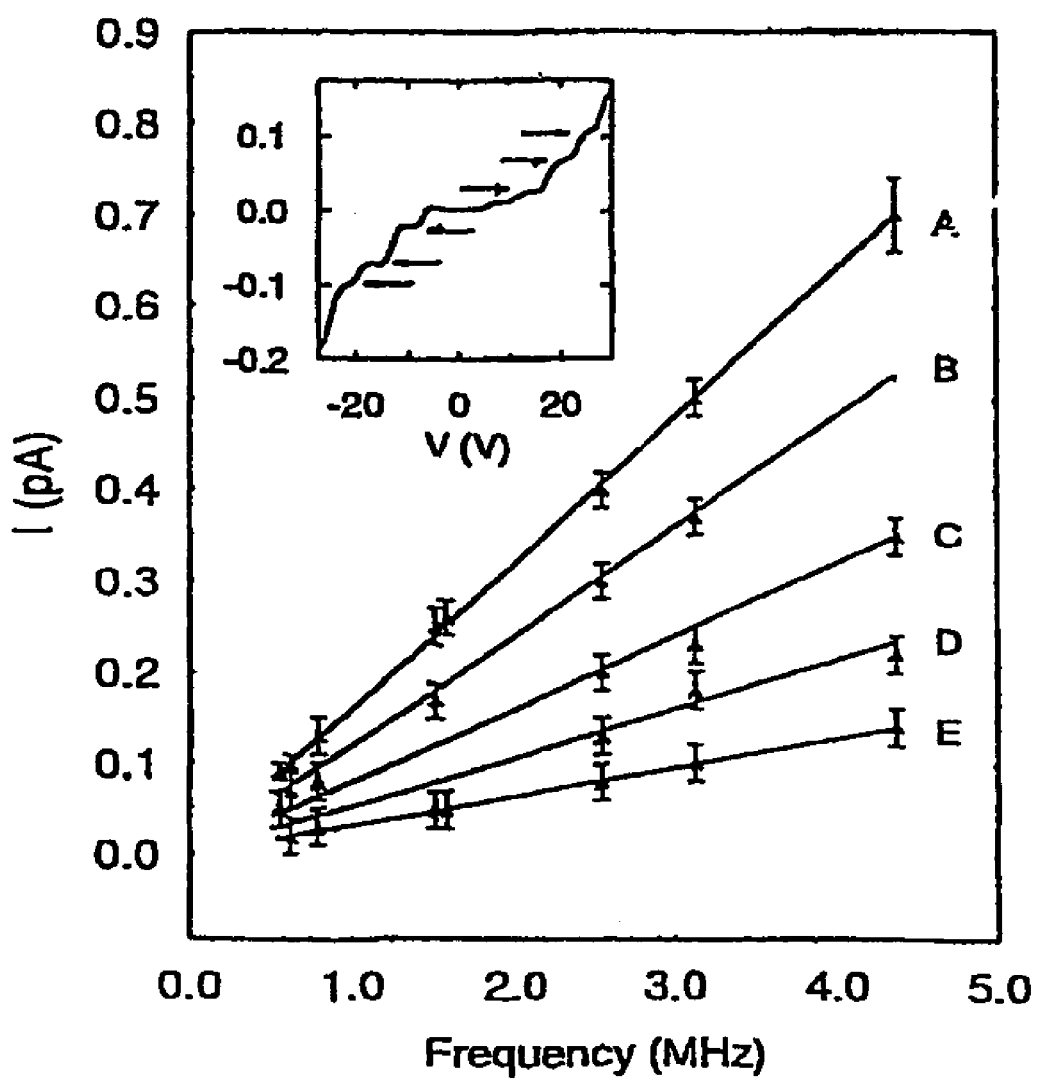
FIG. 8 is a graph illustrating observed current plateaus as a function of the applied frequency at a temperature of 195 K, with the inset illustrating the plateau at f=0.626 MHz.

Application of the RF signal introduced steps in the I-V characteristic, as shown in the inset to FIG. 8. FIG. 8 establishes that an applied external varying signal (the frequency of which is provided by the X axis) actually controls the rate at which electrons move through the metal nanoparticles. The current at which these steps occurred was found to be proportional to the applied signal frequency, as shown in FIG. 8. A least squares analysis of the linear current-frequency relationship for the highest current step shown gives a slope of $1.59\pm0.04\times10^{-19}$ C.

The introduction of plateaus in the patterned sample I-V characteristics is similar to the RF response reported in other Coulomb blockade systems. This effect has been attributed to phase locking of single-electron tunneling events by the external RF signal. When the nth harmonic of the applied frequency corresponds to the mth harmonic of the frequency of tunneling in the system, mIIe, the current becomes locked to a value I=(n/m)ef. The results obtained suggest that correlated tunneling is present in the samples.

The patterned samples had stable I-V characteristics with time and temperature. Furthermore, as the temperature was raised above about 250 K the I-V characteristics developed almost linear behavior up to $V_T$. The conductance below $V_T$ was activated, with activation energies $E_A$ in the range of from about 30 to about 70 meV. The charging energy can be estimated from the activation energy. Assuming current suppression requires $E_c \geqq 10 kT$, the sample with the largest activation energy should develop a Coulomb gap below ~300 K. This value is within a factor of 2 of the measured temperature at which clear blockade behavior occurs in the patterned samples. Given the accuracy to which $E_c$ is known, the temperature dependence of the conductance within the Coulomb gap is consistent with the observation of blockade behavior. Using this value of $E_c$, the effective capacitance of a metal core in the patterned array is $3\times10^{-19}$ F<C<$7\times10^{-19}$ F. These values are close, but larger than the classical geometric capacitance of an isolated 1.4 nm gold nanoparticles nanoparticle, where C=$4\pi\epsilon\epsilon_0 r$~$2\times10^{-19}$ F, and where the dielectric constant, $\epsilon$, of the surrounding ligand shell is expected to be ~3. The agreement between the two estimates indicates that the current suppression in the metal nanoparticle arrays is due to charging of individual 1.4 nm gold nanoparticles.

The non-linear I-V characteristic is similar to that of either a forward biased diode or one-/two-dimensional arrays of ultra small metal islands or tunnel junctions. However, the dependence of the I-V characteristic on the applied RF signal is not consistent with straightforward diode behavior. Therefore, the data has been analyzed in the context of an array of ultra small metal islands.

Several reports have discussed the transport in ordered arrays of tunnel junctions that have tunneling resistances greater than the quantum resistance $h/e^2$ and a charging energy significantly above the thermal energy. In this case Coulomb blockade effects introduce a threshold voltage below which current through the array is suppressed. As the applied voltage is increased well beyond threshold, the current-voltage characteristic approaches a linear asymptote with a slope related to the tunnel resistance. With the same temperature and tunnel resistance constraints, Middleton and Wingreen have discussed one- and two-dimensional arrays of maximally disordered normal metal islands where disorder is introduced as random offset charges on each dot. These authors predict current suppression below a threshold voltage and high bias current I~$(V/V_T-1)^\gamma$. Here, the threshold voltage $V_T$ scales with the number of junctions N along the current direction. Analytically γ=1 for one-dimensional systems and 5/3 for infinite two-dimensional systems. Numerical simulations of a finite two-dimensional array gave γ=2.0±0.2.

Figure 9:
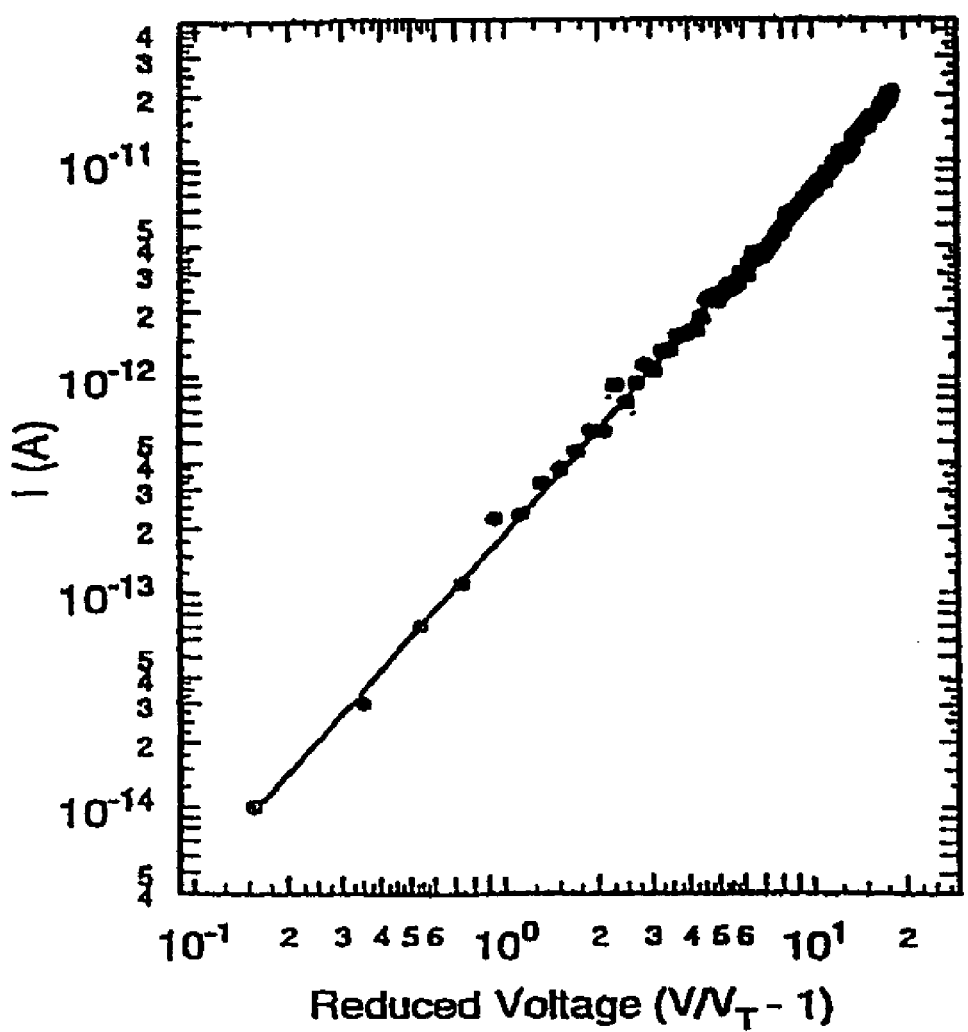
FIG. 9 is a graph illustrating current versus reduced voltage at a temperature of 195 K.

While no effort was made to order samples, data were analyzed using both the ordered and the disordered models. The only consistent analysis was found to be given by the disordered model. In particular, the high bias data did not have the linear asymptote predicted for an ordered system, but did scale as expected for a disordered system, as shown in FIG. 9. FIG. 9 also shows that a two-dimensional array was produced, such that charge propagates through the sample tested along plural parallel paths. Such an arrangement is important for developing memory storage devices. The exponent $\gamma \sim 1.6$ is closest to the analytical prediction for an infinite, disordered two-dimensional array. From the analysis the magnitude of $V_T \sim 6 \pm 1$ V agrees with that estimated directly from the I-V data.

The introduction of steps in the I-V characteristics by a RF field is similar to the RF response reported in other systems. This effect has been attributed to phase locking of single-electron tunneling events by the external RF signal. If the applied frequency corresponds to a rational fraction multiple of the frequency of tunneling in the system, I/e, then the current is locked to a value $I=(n/m)ef$, where n and m are integers. Therefore, the linear relationships shown in FIG. 6 between f and I suggest that correlated tunneling is present in the samples. The lowest slope observed is best described with $n/m=1/5$. For frequencies up to 3 MHz, the current resolution is insufficient to distinguish between the 1/5 and 1/4 harmonics. However, at higher frequencies where it should have been possible to distinguish between 1/5 and 1/4, the 1/4 step was not observed.

At temperatures above about 250 K, the I-V characteristic was almost linear up to $V_T$. In this regime the conductance was activated, with activation energies $E_A$ in the range 30 to 70 meV for the samples studied. Similar activated behavior has been reported for tunnel junction systems. It was argued that for an infinite 2D array the charging energy for one island $E_C \approx 4E_A$. Applying this argument to the present system, and assuming current suppression requires $E_C \geqq 10kT$, the sample with the largest activation energy should develop a Coulomb gap below about 300 K. This estimate is within a factor of two of the measured temperature at which clear blockage behavior is seen. Thus, the temperature dependence of the observed current within the Coulomb gap is consistent with the observation of blockade behavior. From the threshold voltage, $V_T=\alpha Ne/C$, and this estimate of $E_C$, $\alpha N$ is approximately 10.

The energy $E_C$ also can be estimated if the capacitance of an island is known. The capacitance of an isolated 1.4 nm gold nanoparticles nanoparticle is $C=4\pi\epsilon\epsilon_o\tau$, where $\tau$ is the radius of the nanoparticle and $\epsilon$ is the dielectric constant of the surrounding medium. The radius of an 1.4 nm gold nanoparticles nanoparticle is 0.7 nm and the ligand shell is expected to have $\epsilon \approx 3$, which $C \approx 2 \times 10^{-19}$ F. The Coulomb charging energy, $E_C = e^2/2C \approx 340$ meV, is within twenty percent of the maximum value of $4E_A$ found from the activation data. This result suggests that the current suppression is due to charging of individual 1.4 nm gold nanoparticles.

Given the constraint that steps in the I-V characteristics are only found when $f<0.1/(R_TC)$, the fact that steps are seen up to $f=5$ MHz gives the upper limit $R_T<1\times10^{11}\Omega$. The differential resistance obtained from the I-V characteristic well above threshold is anticipated to be $R_{diff} \approx (N/M)R_T$, where M is the number of parallel channels. This estimate yields $N/M \geqq 30$. From the sample dimensions and the size of an individual nanoparticle, a close packed array would have $N/M \sim 5$. This disparity between the expected and experimentally derived values of the N/M suggests that the full width of the sample is not involved in transport. One explanation for the discrepancy in N/M may be that many of the gold cores coalesce during sample fabrication so that transport is dominated by individual nanoparticles between larger regions of gold.

Example 9

Figure 10:
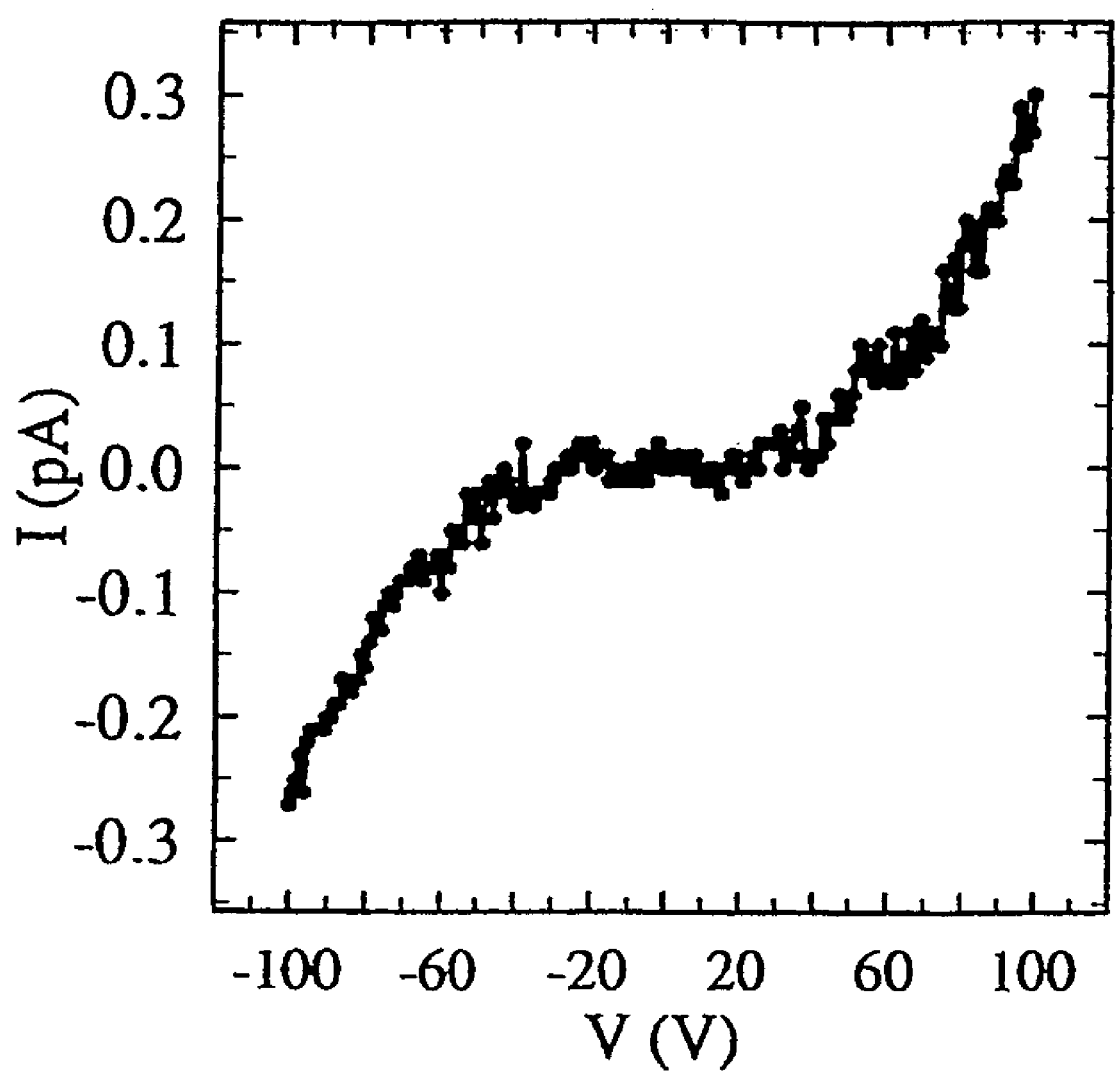
FIG. 10 is a graph illustrating current-voltage (I-V) characteristics of a poly-L-lysine scaffold decorated with 11-mercaptoundecanoic acid ligand-stabilized gold nanoparticles.

This example describes a method for making nanoparticle arrays using poly-L-lysine as the scaffold and 11-mercaptoundecanoic acid ligand-stabilized metal nanoparticles. Prefabricated electrodes were drop-cast with a $2.2 \times 10^{-5}$ mol/l solution of 56,000 amu poly-L-Lysine-HBr in $H_2O/CH_3OH$. After a 20-hour soak in 1% NaOH in nanopure water and a nanopure water rinse, the current-voltage characteristics of the sample were found to be comparable with that of a bare electrode. The polylysine-coated electrode was then exposed to a drop of 11-mercaptoundecanoic acid ligand-stabilized gold nanoparticles in DMSO (about 8 mg/1 mL). After about 20 minutes, the sample was thoroughly rinsed with DMSO, followed by methylene chloride. After correcting for the leakage current of the bare electrode, the current-voltage characteristic of the sample were measured, as shown in FIG. 10.

Figure 11:
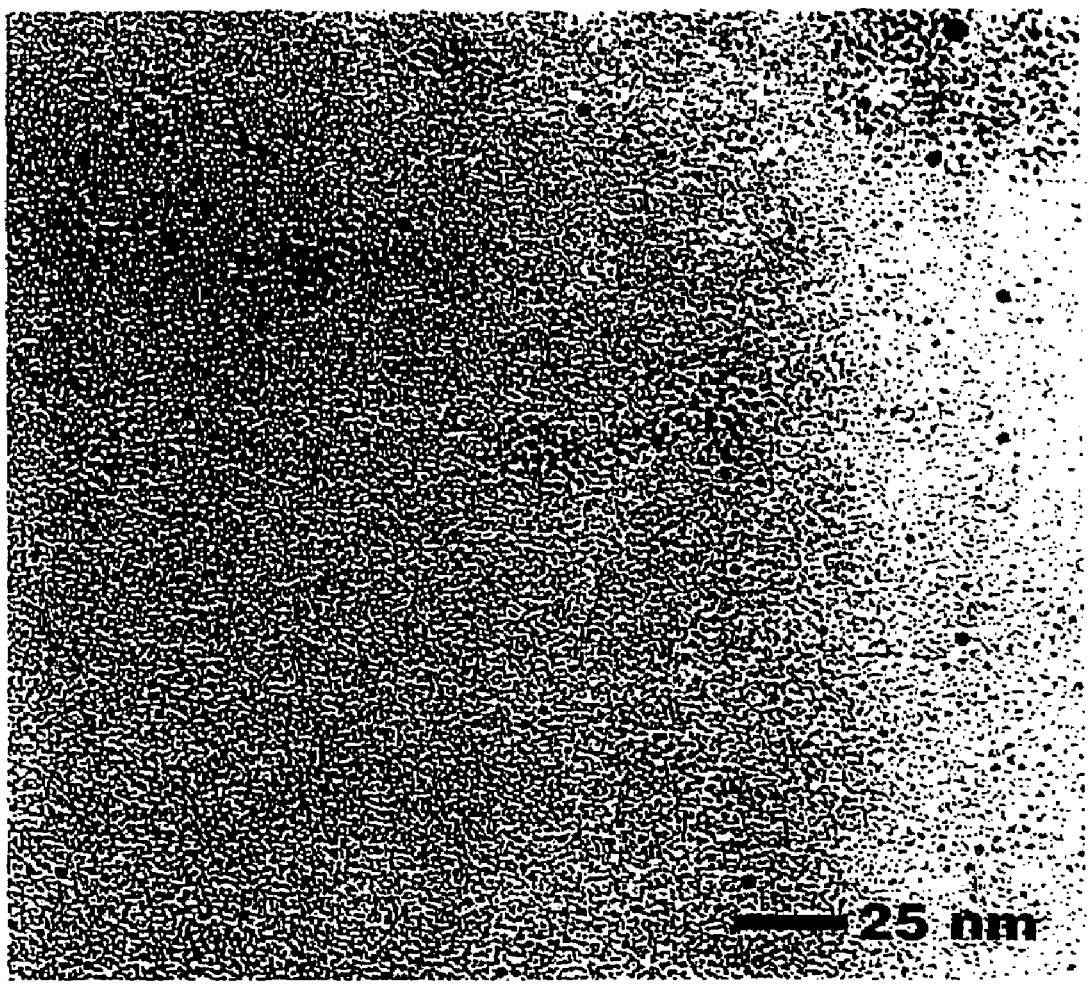
FIG. 11 is a TEM image of a TEM grid having a poly-L-lysine scaffold decorated with 11-mercaptoundecanoic acid ligand-stabilized gold nanoparticles.

A TEM grid was prepared as well using the polylysine scaffold and the 11-mercaptoundecanoic acid ligand-stabilized gold nanoparticles in DMSO. The polylysine solution was drop cast onto TEM grids. A 20-hour soak in 1% NaOH was followed by a nanopure water rinse. The dry TEM grids were then exposed to a drop of 11-mercaptoundecanoic ligand-stabilized gold nanoparticles in DMSO. After about twenty minutes, the grids were thoroughly rinsed, first using DMSO and then using methylene chloride. Lines of nanoparticles can be seen in FIG. 11.

Example 10

This example describes how to make electrical connections to metal nanoparticle arrays. Saw tooth interdigitated array (IDA) gold electrodes are used and are made using electron beam lithography. The gap between saw tooth points in the array will be approximately 200-300 Angstroms. An omega-amino alkylthiol will be chemisorbed to the gold surface and subsequently electrochemically desorbed from one set of the IDA fingers. An omega-NHS-ester alkylthiol will be attached to the bare set of fingers. A precursor to poly-L-lysine will be polymerized from the amino-modified fingers toward the NHS-ester fingers where the growing end will be captured. The side chains of the poly-L-lysine chain will be deprotected and treated with carboxy-terminated gold nanoparticles to form the desired one-dimensional array. Gates will be incorporated either under the substrate or as an additional electrode near (above) the surface of the device.

Example 11

This example describes a method for making phosphine-stabilized gold nanoparticles, particularly 1.4 nm (±0.5 nm) phosphine-stabilized gold nanoparticles. Traditional methods for making such molecules are known, and are, for instance, described by G. Schmid (*Inorg. Syn.* 1990, 27, 214-218) and in Example 1.

Scheme 1

Scheme 1 (above) illustrates a convenient one-pot, biphasic reaction in which the nanoparticles can be synthesized and purified in less than a day from commercially available materials. Hydrogen tetrachloroaurate trihydrate (1.11 g, 3.27 mmol) and tetraoctyl-ammonium bromide (1.8 g, 3.3 mmol) were dissolved in a nitrogen-sparged water/toluene mixture (100 mL each). Triphenylphosphine (2.88 g, 11.0 mmol) was added, the solution stirred for five minutes until the gold color disappeared, and aqueous sodium borohydride (2.0 g, 41.0 mmol, dissolved in 5 mL water immediately prior to use) was rapidly added resulting in a dark purple color (this addition results in vigorous bubbling and should be performed cautiously). The mixture was stirred for three hours under nitrogen, the toluene layer was washed with water (5×100 mL) to remove the tetraoctylammonium bromide and borate salts and the solvent removed in vacuo to yield 1.3 g of crude product.

To effect further purification, the resulting solid was suspended in hexanes, filtered on a glass frit, and washed with hexanes (300 mL) to remove excess triphenylphosphine. Washing with a 50:50 mixture of methanol and water (300 mL) removed triphenylphosphine oxide. Each of these washes was monitored by TLC and the identity of the collected material was confirmed by $^1$H and $^{31}$P NMR. Pure samples were obtained by precipitation from chloroform by the slow addition of pentane (to remove gold salts, as monitored by UV-Vis and NMR). After purification, this procedure yielded 644 mg of purified nanoparticle product from 1.35 g of hydrogen tetrachloroaurate (yield>90%). In contrast, the traditional synthesis yields about 300 mg of purified nanoparticle product per 2 g hydrogen tetrachloroaurate (29% yield).

For comparison of these nanoparticles to the products of the traditional synthesis the newly synthesized nanoparticles were analyzed to determine size, atomic composition, and reactivity as described below. The small size of the nanoparticles, which allows for examination of Coulomb blockade phenomena at room temperature, is an important consideration for evaluating the effectiveness of the synthesis.

Direct evidence of nanoparticle size and dispersity is provided by transmission electron microscopy (TEM). TEM was performed on a Philips CM-12 microscope operating at a 100 kV accelerating voltage. Samples were prepared by drop casting dilute methylene chloride solutions onto 400-mesh nickel grids coated with carbon. Images were recorded as photographic negatives, scanned, and processed using NIH image software. A total of 1628 particles were examined from two separate synthetic runs, for the triphenylphosphine nanoparticles. Background noise and agglomerated nanoparticles were removed from the measurements by removing core sizes of <0.5 nm and >3 nm from the analysis.

Figure 12:
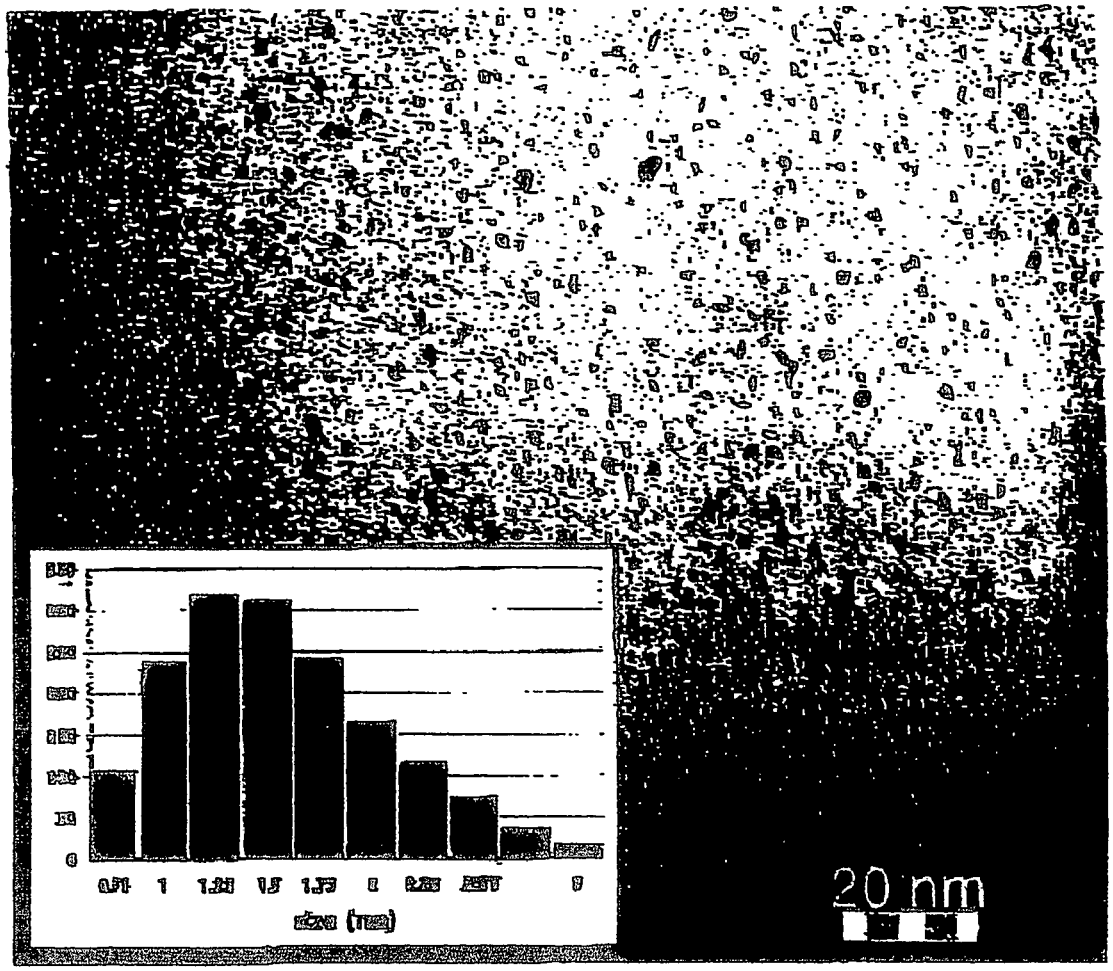
FIG. 12 is a representative TEM image showing nearly monodisperse triphenylphosphine nanoparticle having a particle size of 1.4 nm±0.5 nm.

A representative TEM (FIG. 12) shows nearly monodisperse triphenylphosphine nanoparticles with a size of 1.4 nm±0.5 nm. The FIG. 12 insert is a bar graph showing particle size distribution on this TEM. The x axis of the inset is the size of the particles (measured in nm, starting at 0.75 nm and increasing by increments of 0.25 nm to 3 nm). The y axis of the inset represents the number of particles observed in each size (beginning at zero and increasing by increments of 50 to 350 particles). The size measurements in this TEM compare well with the traditional synthesis, which yields 1.4 nm±0.4 nm particles.

UV/Vis spectroscopy, a technique that is representative of the bulk material, was used to confirm TEM size determinations. UV-visible spectroscopy was performed on a Hewlett-Packard HP 8453 diode array instrument with a fixed slit width of 1 nm using 1 cm quartz cuvettes. The absence of a significant surface plasmon resonance at ~520 nm indicates gold nanoparticles that are <2 nm diameter. UV/Vis spectra of newly synthesized nanoparticles are dominated by an interband transition, with no significant plasmon resonance at 520 nm. This indicates that there is no substantial population of nanoparticles greater than 2 nm in size.

Atomic composition of the nanoparticles was determined using the complementary techniques of x-ray photoelectron spectroscopy (XPS) and thermogravimetric analysis (TGA) allowing further comparison to traditionally prepared nanoparticles. TGA was performed under a nitrogen flow with a scan rate of 5° C. per minute. XPS was performed on a Kratos Hsi operating at a base pressure of $10^{-8}$ torr. Samples were prepared by drop-casting a dilute organic solution of the nanoparticles onto a clean glass slide. Charge neutralization was used to reduce surface charging effects. Multiplexes of carbon, sulfur, and phosphorus were obtained by 30 scans each. Binding energies are referenced to adventitious carbon at 284.4 eV. Data were recorded with a pass energy of 20 eV. XPS spectra provides an average composition of 71% gold, 26% carbon, 2.6% phosphine, and 0.7% chlorine, corresponding to molar ratios of 18 Au: 108 C, 4.3 P:1 Cl. TGA indicates a mass ratio of 71% gold to 29% ligand, independently confirming the ligand-to-ratio determined by XPS. For direct comparison with the nanoparticles made by traditional methods, an average empirical formula was generated by assuming a core size of 55 gold atoms. Based on the average particle size, the particles produced by the method were identified as $Au_{101}(PPh_3)_{12.5}Cl_3$, in comparison with the $Au_{55}(PPh_3)_{12}Cl_6$ reported by Schmid. While the gold-to-phosphorus ratio matches that of the Schmid nanoparticles, the phosphorus-to-chlorine ratio of 4:1 is double that of the Schmid nanoparticles (2:1).

The reactivity of the nanoparticles to thiol ligand exchange further confirms their similarities to traditional triphenylphosphine-stabilized nanoparticles. Using previously reported methods, ligands including a number of straight-chain alkanethiol, such as straight-chain alkylthiols having 2-20 carbon chains, and charged &-functionalized alkanethiol, such as co-carboxyalkanethiols, have been exchanged onto these nanoparticles. In each thiol-for-phosphine ligand exchange reaction, there is little change in the surface plasmon resonance of the UV/V is spectra, indicating negligible size changes during the thiol-for-phosphine ligand exchange. Thus, the newly synthesized nanoparticles are similar in size, atomic composition, and reactivity to the Schmid preparation.

The disclosed methods have enabled the facile exploration of various phosphine ligands that have previously not been explored. Substitution of $PR_3$ for $PPh_3$, and slight modification of the work-up, allows for isolation of trialkylphosphine-stabilized nanoparticles in good yield. Trioctylphosphine- and tricyclohexylphosphine-stabilized gold nanoparticles have been successfully synthesized, which appear to be substantially larger by UV/V is spectroscopy. This approach apparently is the first reported synthesis of trialkylphosphine stabilized gold nanoparticles.

This synthesis allows for the expansion of phosphine-stabilized nanoparticle materials. Large amounts of nanoparticle material can be made in a single step using borohydride in place of diborane. Second, this synthesis allows for flexibility in the choice of phosphine ligand that was previously unknown. Variation of ligand-to-gold ratios using the disclosed embodiments can be used to achieve unprecedented size control of phosphine-stabilized gold nanoparticles.

Example 12

This example describes a method for determining the size of the nanoparticles made using a process similar to that described in Example 11. Controlling the rate at which the reducing agent, such as sodium borohydride, is added to the reaction mixture can be used to make nanoparticles materials having desired core diameters, such as a gold core diameter ($d_{core}$<2 nm). The synthesis is the same in every respect as that stated in Example 8 except for the addition rate of the reducing agent ($NaBH_4$). In Example 11, $NaBH_4$ was added rapidly. In this preparation the same quantity of reducing agent was added slowly (over a period of 10 minutes) from a dropping funnel fitted with a ground glass joint and Teflon stopcock. The resultant nanoparticles were shown by UV-visible spectroscopy to have an average diameter of larger than 2 nm.

Example 13

This example describes the formation of gold nanoparticle networks fabricated between the fingers of gold, interdigitated array electrodes having a 15 (or 1.5) or 2 μm gap by electrostatic assembly of carboxylic-acid-modified, gold nanoparticles onto the amino side chains of the biopolymer poly-L-lysine (PLL). The samples were prepared as follows. First, a $2.2\times10^{-5}$ mol/l solution of poly-L-lysine-hydrobromide complex (54,000 amu) in 10%/90% water/methanol (by volume) was drop cast onto the electrodes. The electrodes were pre-cleaned using a UV/ozone dry process followed by a rinse in nanopure water. The hydrobromide was removed from the amine side chains of the biopolymer by submerging the cast film in a solution of 1% sodium hydroxide in water for about 20 hours. The 11-mercapto-undecanoic-acid-stabilized, gold nanoparticles were synthesized from Schmid-$Au_{55}$ nanoparticles [see, G. Schmid, *Inorg. Synth.* 1990, 27, 214.] using ligand exchange. See L. O. Brown and J. E. Hutchison, *J. Am. Chem. Soc.* 1997, 119, 12384-12385. Nanoparticle decoration of the biopolymer was accomplished by placing a concentrated solution of the nanoparticles in dimethylsulfoxide onto the poly-L-lysine film for about 20 minutes, after which it was rinsed in dimethylsulfoxide and then dichloromethane. From the molecular weight, the average length of the poly-L-lysine was determined to be about 30 nm. Therefore, each polymer accommodated about seven or eight nanoparticles.

Current-voltage (I-V) measurements were performed at room temperature with the samples in an electrically shielded vacuum chamber. See, L. Clarke, M. N. Wybourne, M. Yan, S. X. Cai, and J. F. W. Keana, *Appl. Phys. Lett.* 1997, 71, 617, which is incorporated herein by reference. Control measurements were made on the bare electrodes and again after the PLL had been deposited and deprotonated. The I-V characteristics of the deprotonated PLL and the bare surface were linear (Ohmic) without any structure. Importantly, these two sets of control data were indistinguishable, which shows that to within experimental uncertainty the surface conductance of the glass substrate was unaffected by the deprotonated PLL.

In contrast, when decorated with nanoparticles, the samples exhibited pronounced non-linear I-V characteristics. After subtraction of the linear I-V behavior measured before PLL decoration, to within the measurement accuracy the electrical characteristics showed a region of zero conductance at low voltages. See FIG. 13. The onset of current is characterized by a threshold voltage, $V_T$, that was found to be different for different samples. Above the threshold, the current increases and the scaling $I\alpha(V/V_T-1)^\gamma$ describes all sets of data with $\gamma=1.2\pm0.2$. Here the error includes the uncertainty in the current measurement and the spread between different data sets. At voltages above threshold, structure of period DV was observed in the I-V curves of most samples, with the ratio $\Delta V/V_T\sim2$. This is most easily seen in the conductance, as shown in FIG. 14. For this data the measured threshold voltage is $V_T=12\pm1$ V, and the period of the oscillations is $\Delta V=25\pm3$ V.

Figure 13:
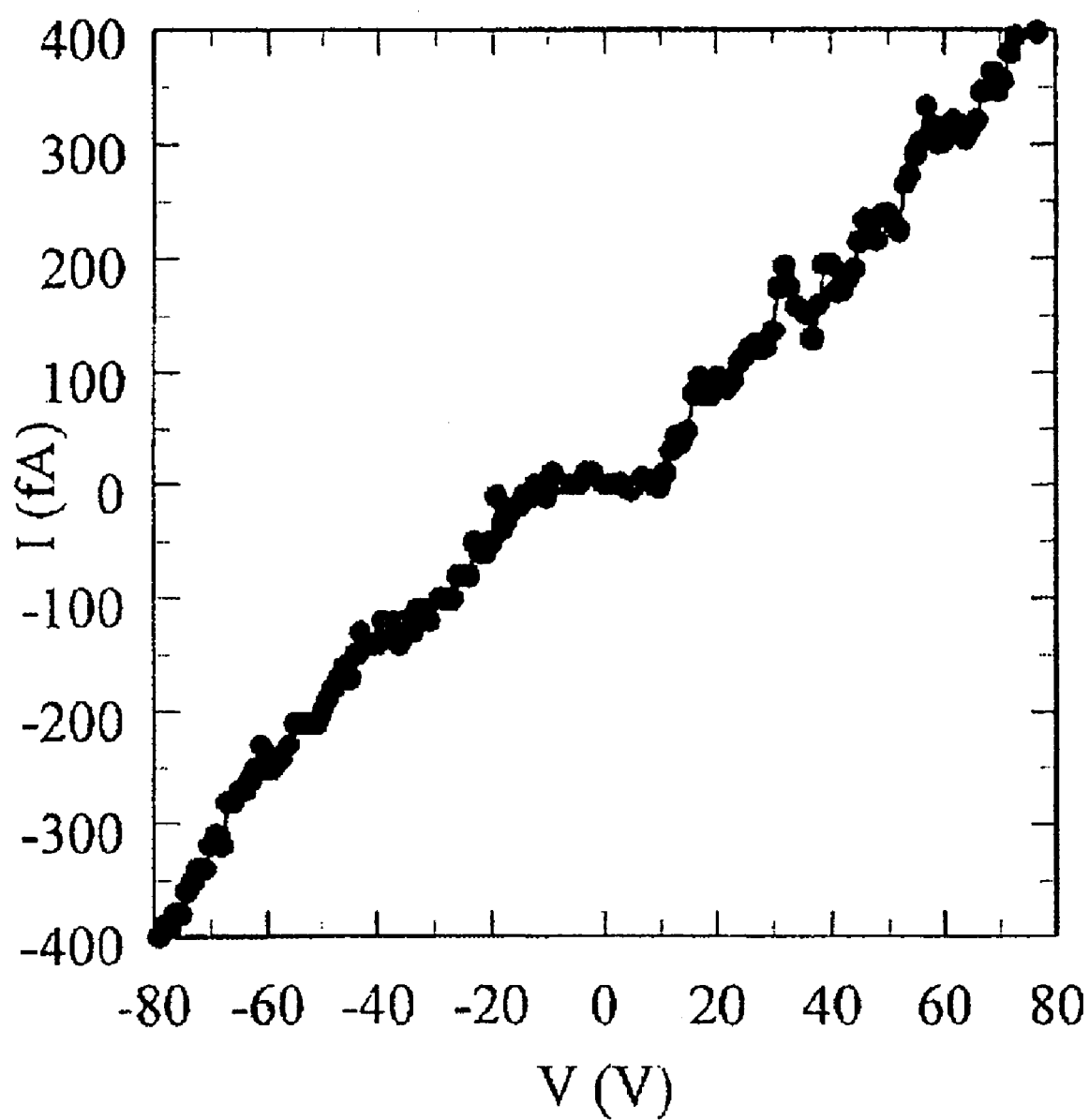
FIG. 13 is a background-subtracted graph of I-V characteristics for PLL films decorated with gold nanoparticles.
Figure 14:
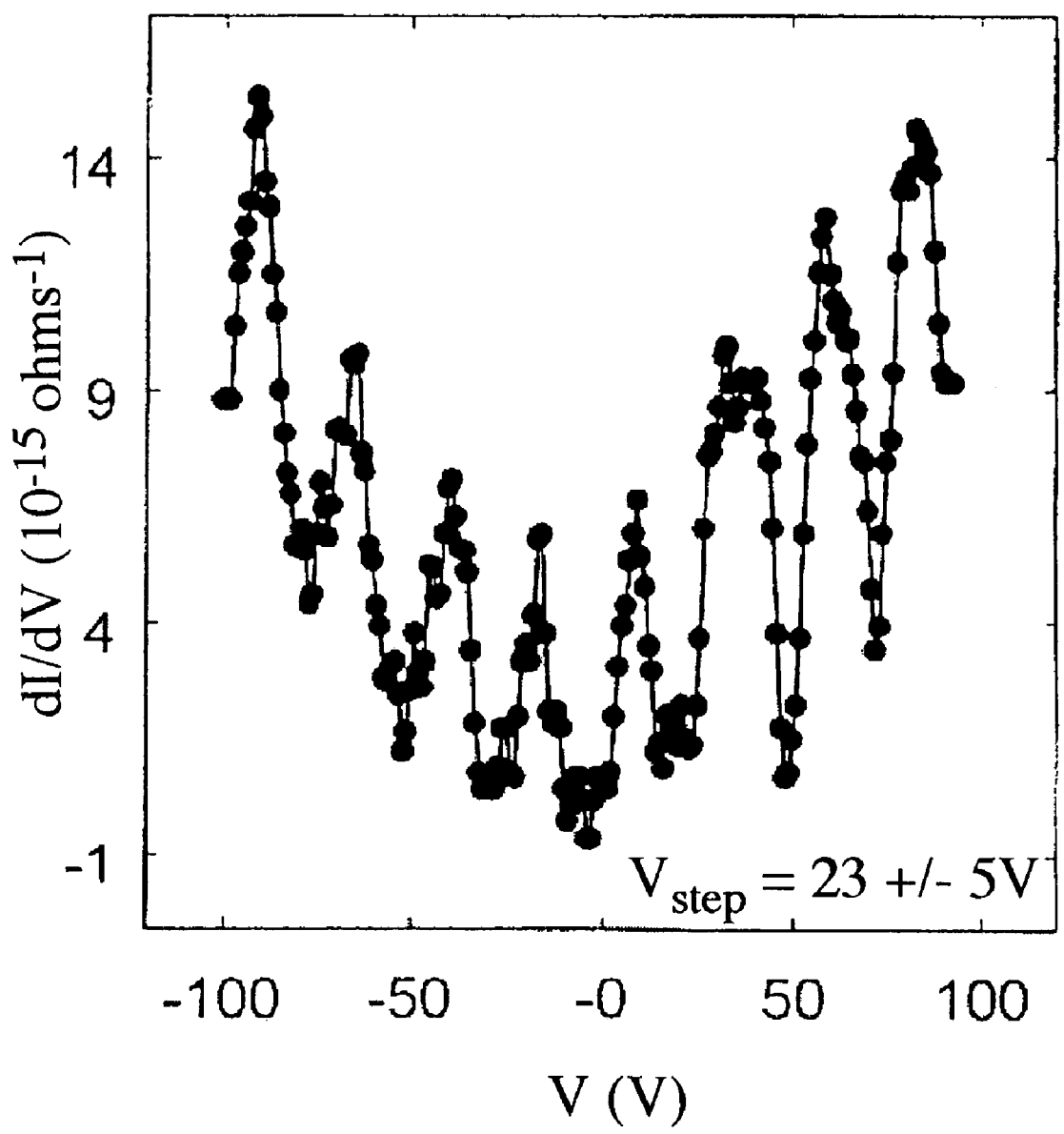
FIG. 14 is a conductance graph of the system of FIG. 13.

Thus, FIGS. 13 and 14 establish stable Coulomb blockade behavior at room temperature for materials produced as described herein. With reference to FIG. 13 and the I-V characteristics of the disclosed systems, above the threshold voltage the current is linear. Moreover, the conductance oscillations show that the systems are defect tolerant.

The value of the scaling exponent γ is indicative of the electronic degrees of freedom in the sample. The values obtained for the tested materials are consistent with single-electron transport in one-dimensional systems where it is predicted that γ~1. These predictions are supported by measurements of the low-temperature transport in one-dimensional chains of lithographically-defined tunnel junctions that found $\gamma=1.36\pm0.1$. Further, the almost linear scaling is distinct from the quadratic scaling reported for thin films containing gold nanoparticles. The current-voltage scaling, threshold behavior and periodic structure are all reminiscent of single-electron behavior in one-dimensional systems, with the region of zero conductance resulting from a Coulomb-gap at the Fermi level. These are remarkable results given the simple method of sample fabrication and the fact that the measurements were made at 300 K. One intriguing feature is the voltage scale of the conductance structure, which is considerably larger than commonly found in other single-electron systems.

Example 14

This example concerns the morphology of nanoparticle/poly-L-lysine (PLL) assemblies. Samples for morphological studies were prepared on mica substantially as described above in Example 13. The assemblies were imaged using tapping mode AFM. The initial, dried PLL.HBr films were found to be smooth with voids probably due to film contraction while drying. During the deprotonation step, PLL is removed and the film becomes more porous, leading to a submonolayer lattice of PLL aggregate. Upon decoration with functionalized nanoparticles, extended, chain-like assemblies were observed. See FIG. 15. Thus, by this method, low dimensional nanoparticle arrays can be made, which allows production of a system having useful electrical properties as opposed to systems comprising monolayers of material.

Figure 15:
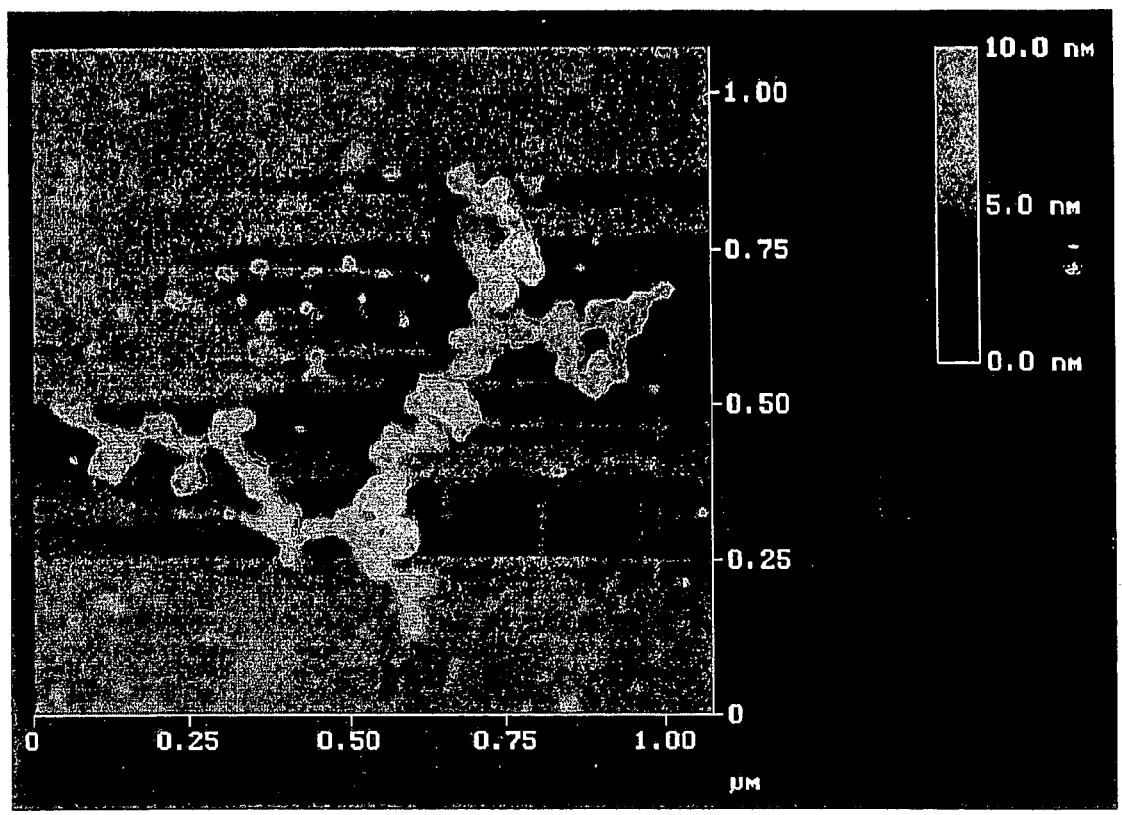
FIG. 15 is a 1×1 μm area showing mercaptoundecanoic acid-stabilized gold nanoparticle arrays formed on mica substrates previously treated with PLL hydrobromide salt and soaked in dilute sodium hydroxide solution until the PLL was no longer detectable by AFM.

FIG. 15 also raises the issue of the effects of disorder and defects. There are two main types of disorder experienced with the disclosed systems, positional disorder and particle size dispersion. FIG. 15 shows that the illustrated embodiment has nanoparticles that are not evenly spaced one from another. This is referred to herein as positional disorder. In traditional semiconductor structures, there is no tolerance for unequal spacing of the metal islands. However, with the small dimensions of the disclosed systems, the electrical properties do not depend on the spacing between nanoparticle. Another potential disorder is particle size dispersion, which can adversely affect the useful electrical properties of the described systems if the dispersion is large enough. For example, a 30% dispersion in particle size may abrogate Coulomb blockade behavior that would otherwise be exhibited by an array of particles.

The described wet chemical fabrication method produces quasi, one-dimensional structures consistent with the morphology suggested by the current scaling above threshold.

The surface coverage of these structures is low, far below that required for a continuous path to be formed between the electrodes. This observation rules out the possibility that bottleneck regions, or a single pathway dominate the electrical behavior. Individual nanoparticles also are found on the surface after chemical fabrication. Their low area density gives an average separation considerably larger than the distance between the nanoparticles forming the extended chains. Thus, the isolated nanoparticles are unlikely to contribute to the overall electrical behavior. The electrical properties suggest single-electron effects in one-dimensional structures and the AFM images show that the fabrication method is capable of producing such structures. However, there is an apparent discrepancy between the disordered nature of the sample seen by AFM (a collection of randomly sized, placed and oriented nanoparticle arrays) and the clearly defined, periodic conductance features in the electrical characteristics that suggest an ordered system. The electrical behavior of randomly oriented nanoparticle arrays that contain defects has been calculated. Periodic conductance features occur despite the presence of defects and that surface conduction in conjunction with conduction through the array explains the large voltage scale found in the data.

Single-electron charging effects are governed by the capacitance between adjacent nanoparticles and the capacitance of each nanoparticle to a ground plane. The nanoparticles can be treated as identical metal spheres of radius 0.7 nm surrounded by a homogeneous ligand shell with a dielectric constant of 3. Including the ligand shell, the minimum center-to-center separation is 4.2 nm. Calculating the capacitance matrix for a row of nanoparticles the interparticle capacitance was determined to be Cdd≈0.04 aF and a capacitance to ground $C_g$≈0.17 aF. Thus, the dimensions of these nanoparticle building blocks result in a regime where $C_g > C_{dd}$, which is opposite to that studied in most lithographically defined systems. The capacitance values imply that the total capacitance of a nanoparticle is dominated by $C_g$ and the calculated value shows that the 5 electrostatic charging energy $e^2/2C_g$ is more than an order of magnitude larger than $k_B T$ at 300 K, consistent with Coulomb blockade effects at room temperature.

Numerical simulations of perfect chains confirm that threshold behavior, linear scaling above threshold and a Coulomb staircase can all be expected at room temperature. To simulate the number of conductance peaks observed, a minimum of four particles is required in a chain. While the expected and experimental values of the ratio $\Delta V/V_T$ agree, there is a discrepancy in the absolute voltage values for the threshold and the periodicity. The anticipated value of $V_T \approx e/2C_g = 0.47$ V is more than a factor of twenty smaller than the measured value. Reducing $C_g$ increases $V_T$. However, assuming that at very small dimensions the capacitance still can be estimated from the geometry of a particle, the reduction in $C_g$ necessary to explain the data would require nanoparticles with unphysically small radii. From this argument it appears that the conduction path must include potential drops that may be the result of contact resistance between the electrodes and the nanoparticle system, surface conduction, weak links within the network itself, or a combination of all three.

The presence of radio frequency (RF) signals and other phenomena, such as quantum size effects and the physical motion of nanoparticles in a field (the shuttle mechanism) also can introduce conductance features. RF signals applied to the sample had no perceivable affect on the conductance structure. Quantum size effects are weak at room temperature and the energy level structure is highly dependent on the structure of the nanoparticles, the ligands and the coupling between particles. Thus, it seems unlikely that resonant tunneling through discrete electronic levels is the cause of the observed, regularly spaced structure. A shuttle mechanism is ruled out because it predicts structure equally spaced in current rather than in voltage as found with the present systems. For the I-V characteristics measured, this mechanism also would require vibrational frequencies that are much lower than is reasonable for the properties of the ligand.

Given the preparation method and the large area (~3 mm²) sampled by the IDA electrodes, disorder and spatial averaging are expected in the samples. The types of disorder expected to have the greatest influence on the electrical properties are variations in core size that influence $C_g$ and the particle-particle spacing (positional disorder) that affects Cdd. In addition, the effects of particle chain length and chain orientation must be considered. Numerical simulations were used to explore these effects individually and in combination. Chains having between four and nine particles whose core radii were randomly dispersed by up to ±30% (the measured value) showed conductance structure that was periodic to within the measurement uncertainty (±12%). For chains that contain ten or more particles, the uncertainty in the periodicity was much larger than measured. Similarly, when the radius dispersion was increased to ±50% the position of the conductance peaks was found to change significantly and the ratio $\Delta V/V_T$ deviated markedly from a value of two. Dispersion in $C_{dd}$ due to a distribution of particle-particle spacings was found to have little effect on the features. This is not surprising for a system in which $C_g > C_{dd}$ since the conductance is relatively insensitive to the inter-particle capacitance. From this analysis it appears that individual, one-dimensional chains containing less than ten particles with ±30% radius variation support Coulomb staircase behavior.

When many chains are arranged in parallel the periodicity is maintained provided the chain lengths have a narrow distribution, implying that the samples contain chains of a well-defined length. This length may arise from individual PLL chains that, based on their molecular weight, can accommodate seven or eight nanoparticles. Given length uniformity, angular averaging over all possible orientations of a perfect chain between the electrodes does not remove the conductance peaks, but does broaden them and increases the conductance in the valleys between peaks. When core size dispersion (±30%) and orientation averaging are combined, the simulations still predict periodicity in the conductance. For these simulations 756 chains each having a different randomized set of capacitances and a different orientation were used. Interestingly, even with this degree of averaging, residual conductance periodicity is still found. While a direct comparison with the measured data cannot be made, it appears as if the amount of disorder used in the simulations overestimates the actual degree of disorder in the samples.

Finally, note that the nature of the current path and the fact that the measured voltage scale of the Coulomb blockade structure disagrees with the value determined from the capacitance. The conduction process must involve both the chains and the surface of the substrate. The origin of the surface conductance is likely a thin water layer, which is known to have Ohmic behavior and is expected given the wet chemical preparation method. The surface conductance is the background that is removed from the data and is the means by which chains, arranged randomly on the surface, are electrically connected. Once the potential drop across a chain reaches the threshold value, the chain will come out of blockade and become part of the conduction path. Given that the chains are short compared to the inter-electrode spacing and that there does not appear to be a continuous path between the electrodes, the point at which a chain begins to conduct is a particular fraction of the applied voltage: that is, the surface conductance behaves in the manner of a potential divider which provides an explanation for the difference between the predicted and observed scales. It is known that the interparticle spacing in ordered arrays of nanoparticles plays a role in the nature of the electrical transport. In certain embodiments of the arrays described herein the ligands provide a core separation that suggests electron hopping is the process responsible for charge transfer. In this case, transport will be dominated through chains that have the lowest potential barriers between nanoparticles. Defects are expected to increase the potential barrier. Hence, chains that have the fewest missing or misplaced nanoparticles (defects) will govern the transport properties.

The wet chemical process has been used to produce extended nanoparticle arrays on biopolymer templates between electrode pairs. The I-V characteristics show clear evidence for single-electron charging effects in transport that is limited to one-dimension. From the computed capacitance values and numerical simulations the chains likely contain between four and nine nanoparticles and that the I-V behavior of an ensemble of chains interconnected by the surface conduction of the substrate is tolerant toward variations of chain orientation, core size and inter-particle spacing. The measurements reported here used indirect electrical contact to an ensemble of nanoparticle arrays. This suggests that similar contact techniques which avoid alignment between electrodes and nanoparticles will be useful in their future electrical characterization and application.

Example 16

This example concerns using DNA as a scaffold for receiving nanoparticles. Thin macroscopic gold or silver pads are deposited onto freshly cleaved mica through a shadow mask that defines contacts. Vacuum annealing is used, where necessary, to produce flat metal surfaces. Silver is preferred because it does not interfere with the detection of gold particles on the surface by XPS. Purified λ DNA (a Hind III digest from New England BioLabs, Inc., consists of eight fragments of defined length, ranging from 42-7,800 nm) is deposited onto the mica substrate in the presence of $Mg^{2+}$ that serves to bind the DNA to the mica such that the DNA double strands are extended along the surface. Alternatively, DNA may be attached to the surface through physisorption or through a molecular film. Some of these strands rest partially on the gold pads and partially on the mica surface. These samples, after rinsing and drying, are used for control experiments and as templates for assembling the gold nanoparticles. Individual undecorated double-stranded DNA chains are identified by AFM. A survey of the periphery of the electrode contact pads reveals the number of appropriate strands on the surface and aids in optimizing the deposition conditions.

Figure 17:
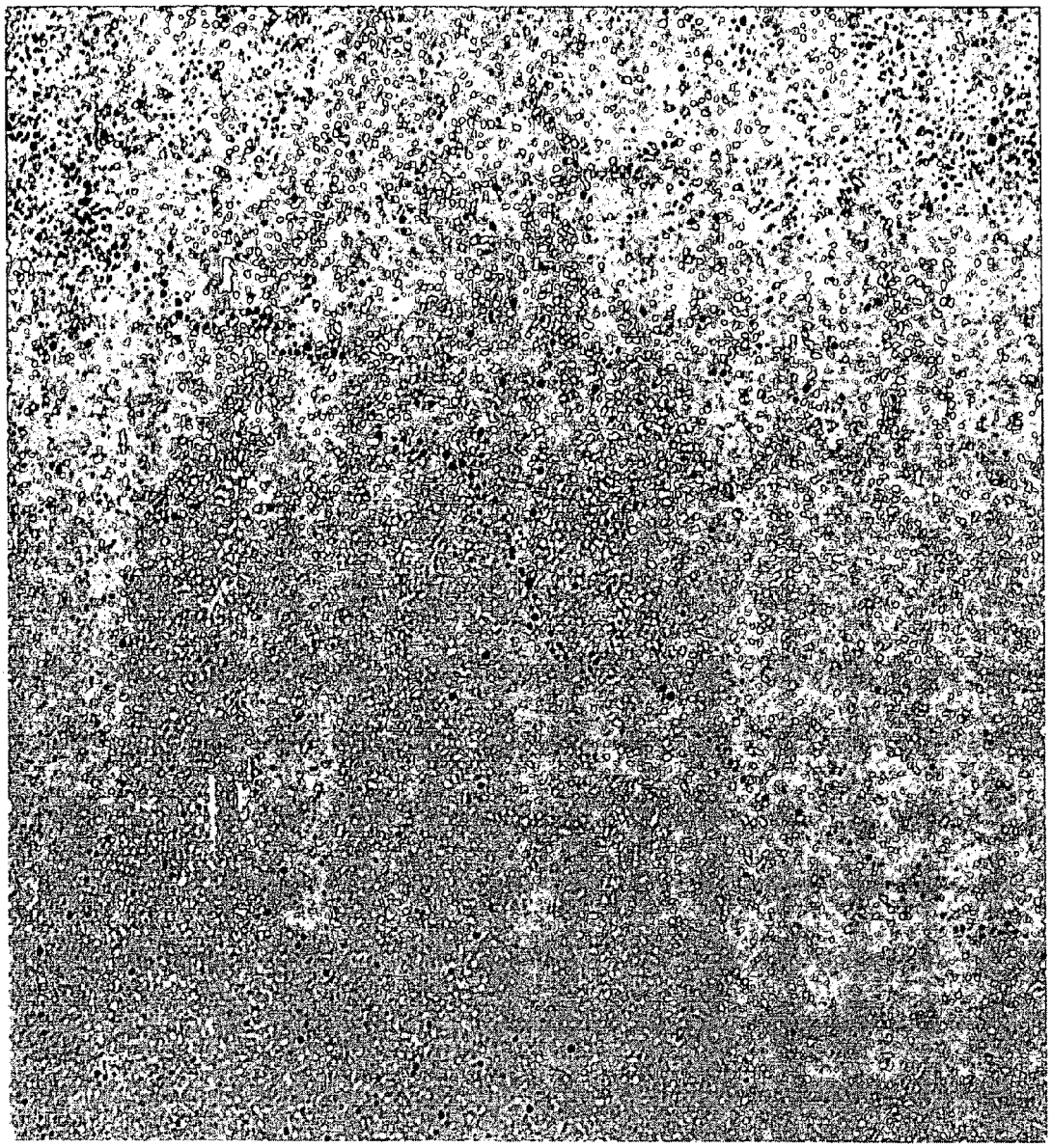
FIG. 17 is a TEM image of a DNA strand decorated with trimethylammonium, ethanethiol-stabilized particles prepared according to Example 16.

Functionalized nanoparticles for assembly on the DNA templates are prepared as described herein. For example, one embodiment of such a method was used to make functionalized, 1.5 nm diameter gold nanoparticles. The reaction conditions were as described in Example 11 and Example 3 or 6. A TEM image of a DNA strand decorated with trimethylammoniumethanethiol-stabilized particles is shown in FIG. 17.

Example 17

This example describes a method for making an intentionally crossed junction of DNA-templated, one-dimensional, nanoparticle assemblies. DNA is first attached to an electrode, such as by using a thiol linkage. The DNA is then correctly aligned by flow-induced alignment of the DNA strand. The DNA strand is bound to the mica surface, such as by using $Mg^{2+}$. Cationic nanoparticles are deposited onto the DNA template, and the DNA is attached to the adjacent electrode. A second DNA strand is aligned by flow-induced alignment orthogonal to the first DNA strand. The second DNA strand binds to the cationic nanoparticles on the first DNA strand. Additional cationic nanoparticles may be deposited onto the new DNA strand to form an intentionally crossed junction of DNA-templated, one-dimensional nanoparticle assemblies.

In another embodiment, complex DNA architectures, such as Holliday junctions, are used as the scaffold for creating patterns of nanoparticles between electrodes. Assembly of branched structures on electrode patterned surfaces provide a method for assembling gates of electronic dimensions. For example, crossed strands of nanoparticles, where the two strands are produced from nanoparticles of differing radii, may be used to produce a molecular-scale gate for the strand having the smaller radius nanoparticles.

Example 18

Figure 16:
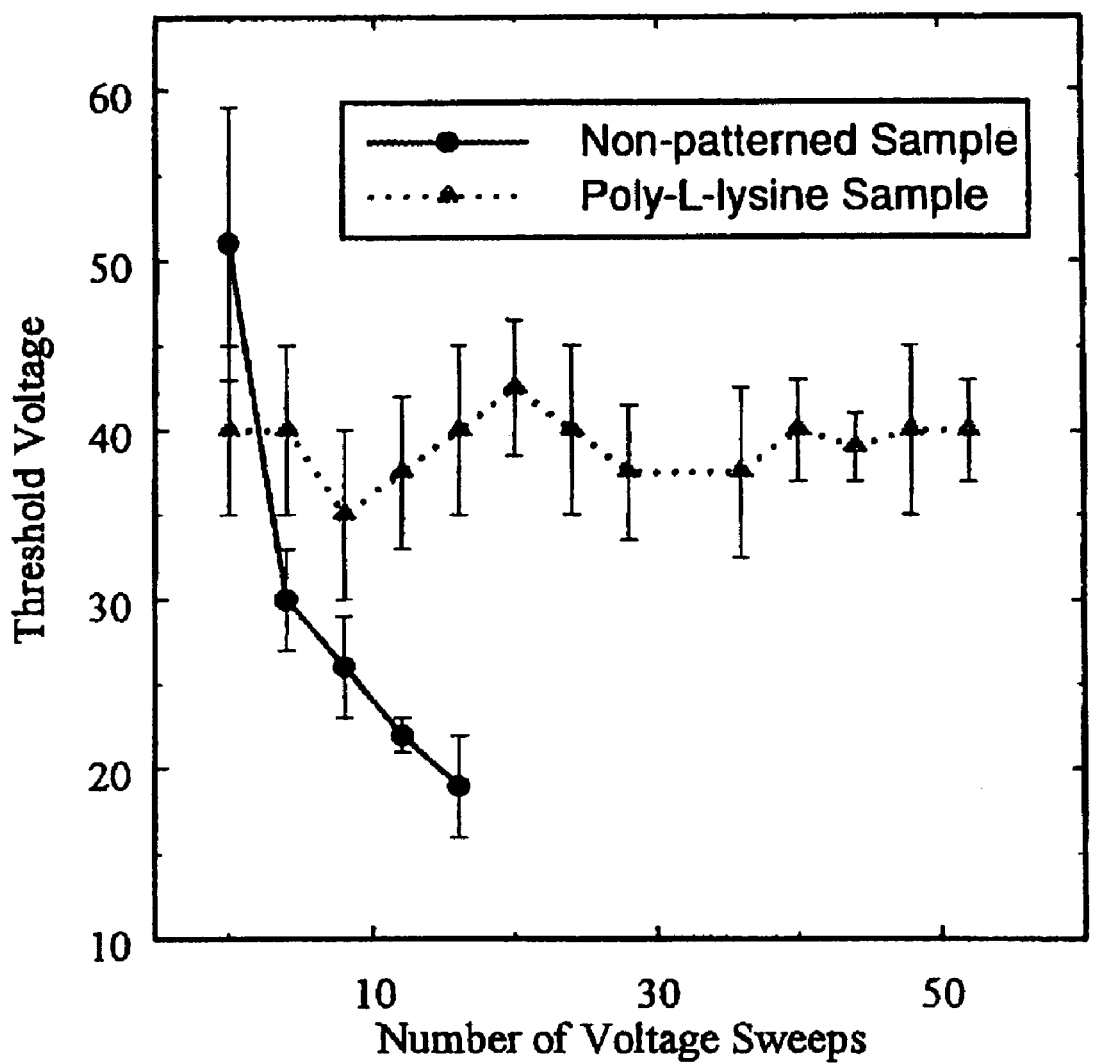
FIG. 16 is a graph of voltage sweeps versus threshold voltage for a non-patterned sample versus a poly-L-lysine-patterned sample.

FIG. 16 illustrates that the poly-L-lysine templated sample has a stable and reproducible voltage response, and that the response of the system does not decay over time. In contrast, when a template is not used and a non-patterned system is formed, the response decays. Thus, the template stabilizes the voltage response, likely because the particles are in fixed positions, and hence such systems are electrically more stable than systems that are not patterned.

The disclosed embodiments provide a novel approach to providing structures having well defined electrical properties. Coulomb blockade at room temperature is routinely observed in these systems, and the Coulomb blockade response is stabilized using biopolymer templating. And, single-electron charging effects in one-dimensional pathways are remarkably tolerant of defects and disorder.

The present invention has been described with reference to preferred embodiments. Other embodiments of the invention will be apparent to those of ordinary skill in the art from a consideration of this specification, or practice of the invention disclosed herein. It is intended that the specification and examples be considered as exemplary only, with the true scope and spirit of the invention being indicated by the following claims.

We claim:

1. A gold nanoparticle, comprising:
   exactly 11 gold atoms arranged in a core; and
   at least one sulfur-bearing ligand directly bonded to the core, wherein the ligand is a neutral or cationic group and the sulfur is bonded directly to the gold core.

2. The gold nanoparticle of claim 1, wherein the ligand comprises an aryl group, an unsubstituted alkyl group, an amine group, an ammonium group or a combination thereof.

3. The gold nanoparticle of claim 1, wherein the ligand comprises a quaternary ammonium group.

4. The gold nanoparticle of claim 1, wherein the ligand is an alkyl thiol.

5. The gold nanoparticle of claim 4, wherein the alkyl thiol comprises from 2 to about 20 carbon atoms.

6. The gold nanoparticle of claim 5, wherein the ligand is octadecanethiol.

7. The gold nanoparticle of claim 1, wherein the ligand comprises an aryl group.

8. The gold nanoparticle of claim 1, wherein the ligand comprises an intercalator.

9. The gold nanoparticle of claim 8, wherein the ligand comprises a mercaptobiphenyl group.

10. The gold nanoparticle of claim 9, wherein the ligand is 4-mercaptobiphenyl.

11. A gold nanoparticle, comprising:
exactly 11 gold atoms arranged in a core; and
at least one ligand directly bonded to the gold core, wherein the ligand has the formula —NHR, where R is selected from alkyl groups having 20 or fewer carbon atoms; —SR, where R is selected from the group aryl and aliphatic groups having 20 or fewer carbon atoms; —S—$(CH_2)_x$COOH, where x is from about 2 to about 20; —S—$(CH_2)_x$OH where x is from about 2 to about 20; the formula —S—$(CH_2)_x$NR$_2$, where R is independently selected from the group consisting of hydrogen and $C_1$-$C_4$ alkyl and x is from about 2 to about 20; —S—$(CH_2)_x$NR$_3^+$, where R is independently selected from the group consisting of C1-C4 alkyl and x is from about 2 to about 20; or —S—$(CH_2)_x$CONH$(CH_2)_y$CH$_3$, where x+y is from 1 to about 20.

12. The gold nanoparticle of claim 11, wherein the ligand is a thiol.

13. The gold nanoparticle of claim 11, wherein the ligand comprises an aryl group.

14. The gold nanoparticle of claim 13, wherein the ligand comprises an intercalator.

15. The gold nanoparticle of claim 11, wherein the ligand comprises an alkene.

16. The gold nanoparticle of claim 11, wherein the ligand comprises an amine group, ammonium group or both.

17. The gold nanoparticle of claim 11, wherein the ligand has the formula —SR, and R is selected from the group consisting of phenyl, biphenyl and alkyl groups having 20 or fewer carbon atoms.

18. The gold nanoparticle of claim 11, wherein the ligand comprises a hydroxyl group.

19. The gold nanoparticle of claim 11, wherein the ligand is octadecanethiol, N,N-dimethylamino ethanethiol, or 4-mercaptobiphenyl.

20. The gold nanoparticle of claim 11, wherein the gold nanoparticle comprises plural ligands.

21. The gold nanoparticle of claim 20, comprising from 2 to about 20 ligands.

22. A composition comprising a gold nanoparticle according to claim 11 non-covalently associated with DNA.

23. The composition of claim 22, wherein at least one ligand of the gold nanoparticle comprises an amine group, an ammonium group, or both.

24. The composition of claim 23, wherein the ligand comprises an N,N-dimethylamino ethanethiol group.

25. The composition of claim 22, wherein the DNA is capable of forming an α-helix.

26. The composition of claim 22, wherein at least one ligand of the gold nanoparticle comprises an aryl group.

27. The composition of claim 26, wherein the aryl group is an intercalator.

28. The composition of claim 26, wherein the ligand comprises a 4-mercaptobiphenyl group.

29. The composition of claim 22, further comprising plural gold nanoparticles non-covalently associated with the DNA.

30. The composition of claim 29, wherein the plural gold nanoparticles are substantially monodisperse.

31. A gold nanoparticle, comprising:
exactly 11 gold atoms arranged in a core; and
at least one ligand coordinated to the gold core, wherein the ligand has the formula:
—NHR, wherein R is selected from alkyl groups having 20 or fewer carbon atoms, and the nitrogen atom is directly bonded to the gold core;
—SR, wherein R is selected from the group of aryl and aliphatic groups having 20 or fewer carbon atoms, and the sulfur atom is bonded directly to the gold core;
—S—$(CH_2)_x$COOH, wherein x is from about 2 to about 20, and the sulfur atom is bonded directly to the gold core;
—S—$(CH_2)_x$OH wherein x is from about 2 to about 20, and the sulfur atom is bonded directly to the gold core;
—S—$(CH_2)_x$NR$_2$, wherein R is independently selected from the group consisting of hydrogen and $C_1$-$C_4$ alkyl and x is from about 2 to about 20, and the sulfur atom is bonded directly to the gold core;
—S—$(CH_2)_x$NR$_3$, wherein R is independently selected from the group consisting of C1-C4 alkyl and x is from about 2 to about 20, and the sulfur atom is bonded directly to the gold core; or
—S—$(CH_2)_x$CONH$(CH_2)_y$CH$_3$, wherein x+y is from 1 to about 20, and the sulfur atom is bonded directly to the gold core.

* * * * *

UNITED STATES PATENT AND TRADEMARK OFFICE
CERTIFICATE OF CORRECTION

PATENT NO. : 7,626,192 B2 Page 1 of 1
APPLICATION NO. : 11/120352
DATED : December 1, 2009
INVENTOR(S) : Hutchison et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1245 days.

Signed and Sealed this

Second Day of November, 2010

David J. Kappos
*Director of the United States Patent and Trademark Office*